(12) United States Patent
Matsuki et al.

(10) Patent No.: US 6,548,898 B2
(45) Date of Patent: Apr. 15, 2003

(54) EXTERNAL CONNECTION TERMINAL AND SEMICONDUCTOR DEVICE

(75) Inventors: Hirohisa Matsuki, Kawasaki (JP); Yutaka Makino, Kawasaki (JP); Masamitsu Ikumo, Kawasaki (JP); Mitsutaka Sato, Kawasaki (JP); Tetsuya Fujisawa, Kawasaki (JP); Yoshitaka Aiba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/895,330

(22) Filed: Jul. 2, 2001

(65) Prior Publication Data

US 2002/0121709 A1 Sep. 5, 2002

(30) Foreign Application Priority Data

Dec. 28, 2000 (JP) ........................................ 2000-402535

(51) Int. Cl.[7] .............................................. H01L 23/52
(52) U.S. Cl. ................. 257/746; 257/751; 257/744; 257/764; 257/766; 257/767; 257/772; 257/701; 257/738; 257/741; 257/750
(58) Field of Search ................................. 257/751, 746, 257/744, 742, 758, 764, 766, 767, 772, 779, 784, 700, 701, 786, 737, 738, 734, 741, 750

(56) References Cited

U.S. PATENT DOCUMENTS

| 4,634,638 | A | * | 1/1987 | Ainslie et al. .............. 428/671 |
| 5,112,763 | A | * | 5/1992 | Taylor et al. ...... 148/DIG. 100 |
| 5,128,827 | A | * | 7/1992 | Yokotani et al. ........... 29/25.42 |
| 6,184,061 | B1 | * | 2/2001 | Wu et al. .................... 438/106 |
| 6,224,690 | B1 | * | 5/2001 | Andricacos et al. ........ 148/400 |

FOREIGN PATENT DOCUMENTS

| JP | 3-209725 | 9/1991 |
| JP | 5-55278 | 3/1993 |
| JP | 5-299534 | 11/1993 |
| JP | 09505439 W | * 5/1995 |
| JP | 9-8438 | 1/1997 |
| JP | 2000-22027 | 1/2000 |
| JP | 2000-133739 | 5/2000 |
| WO | WO 95/14314 | 5/1995 |

* cited by examiner

Primary Examiner—Nathan J. Flynn
Assistant Examiner—Pershelle Greene
(74) Attorney, Agent, or Firm—Armstrong, Westerman & Hattori, LLP

(57) ABSTRACT

A structure in which a phosphorus-nickel layer, a rich phosphorus nickel layer that contains phosphorus or boron higher than this phosphorus-nickel layer, a nickel-tin ally layer, a tin-rich tin alloy layer, and a tin alloy solder layer are formed in sequence on an electrode. Accordingly, adhesiveness between a metal pattern used as the electrode, the wiring, or the pad and the solder can be improved.

28 Claims, 39 Drawing Sheets

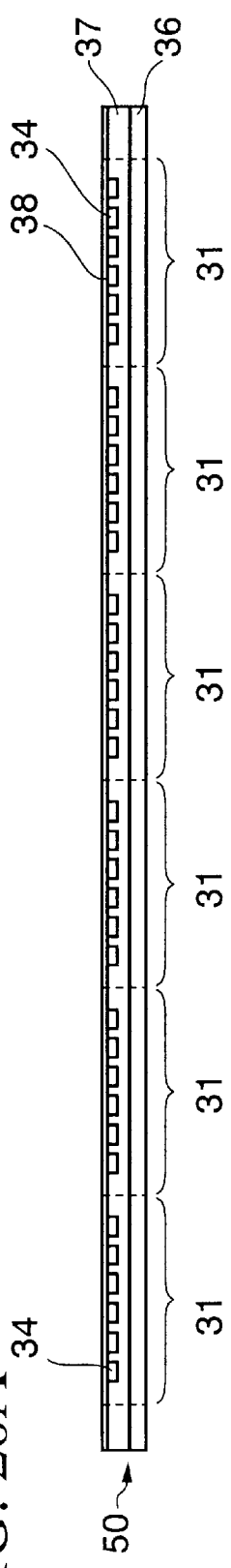
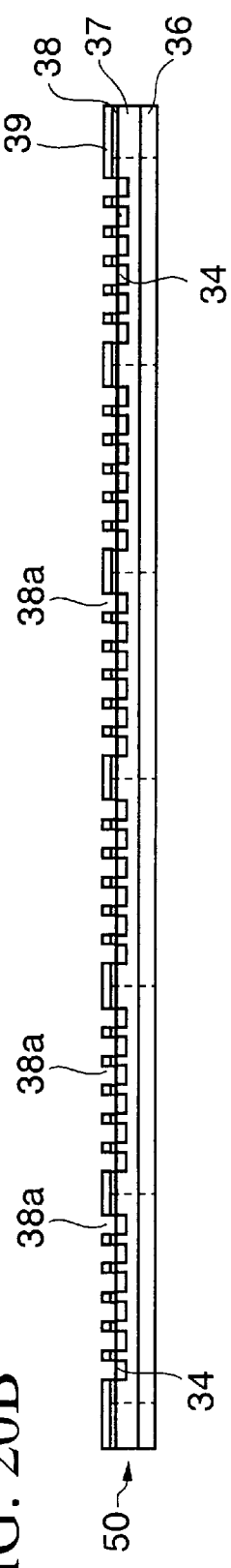
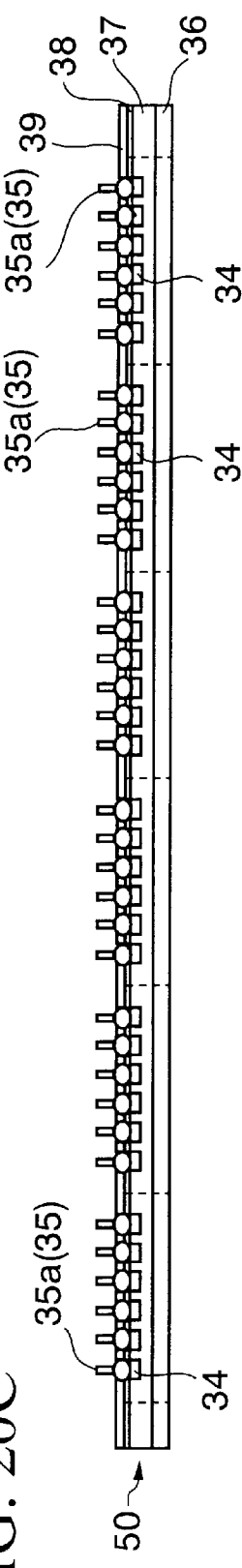
FIG. 20A
FIG. 20B
FIG. 20C

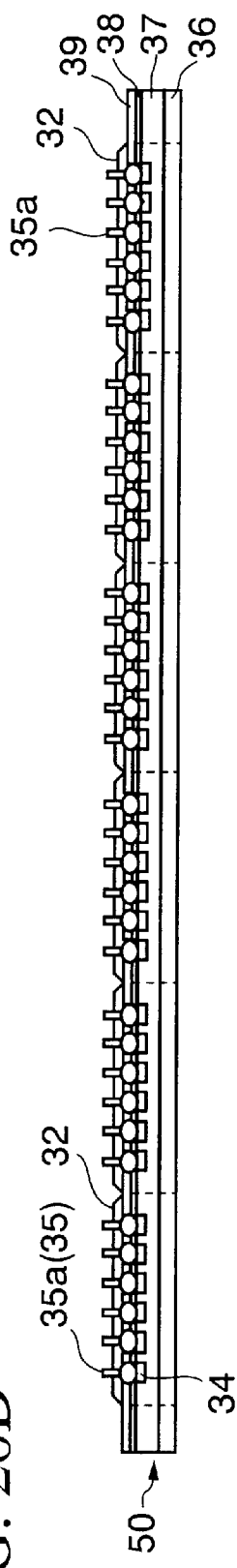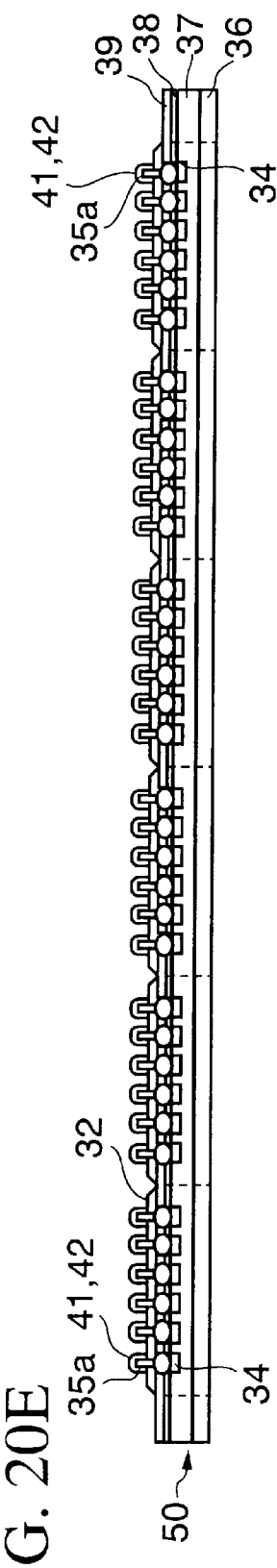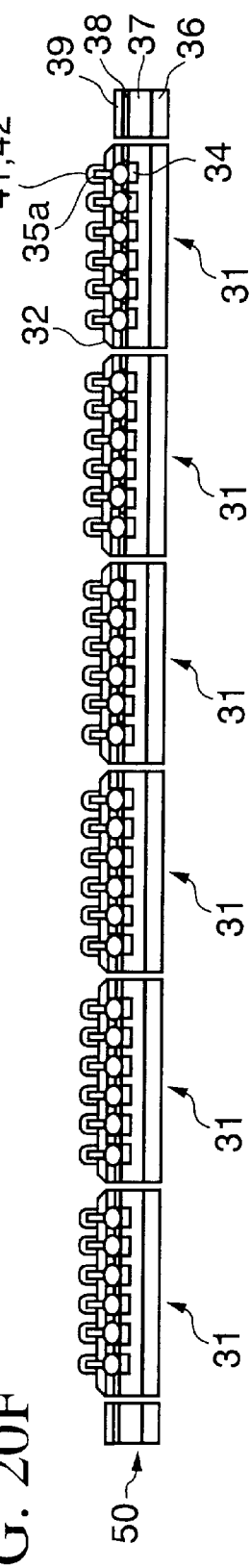

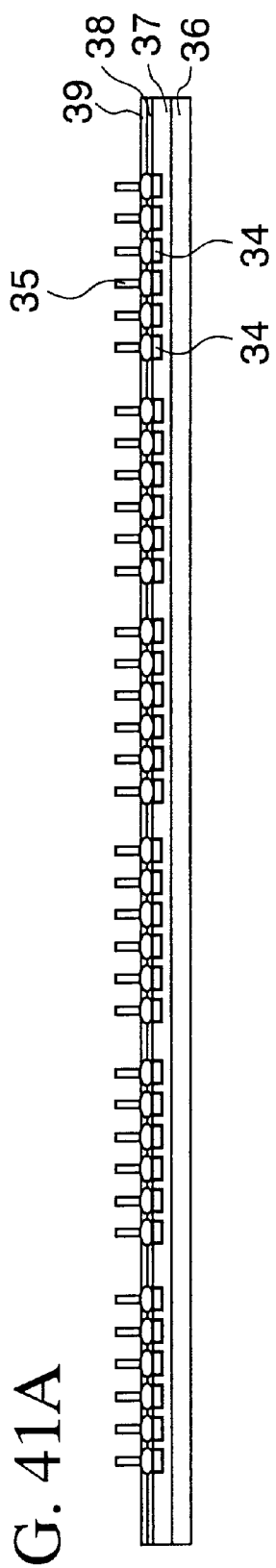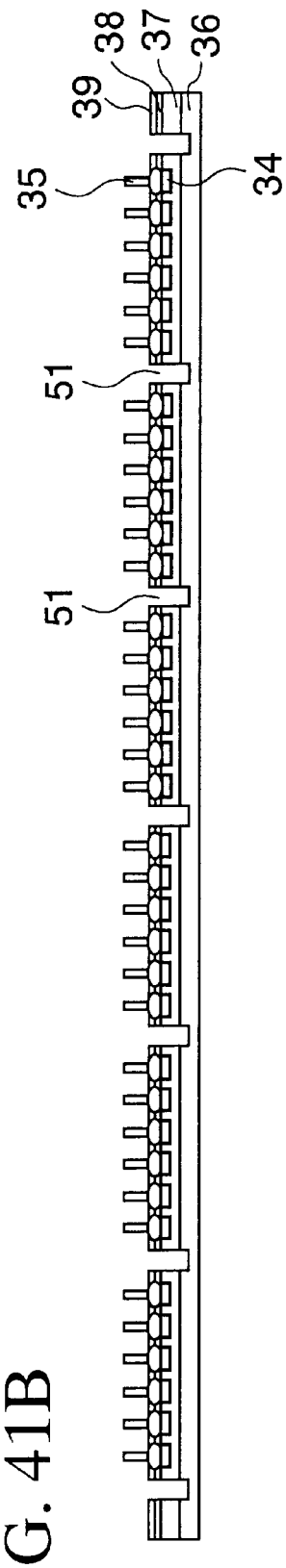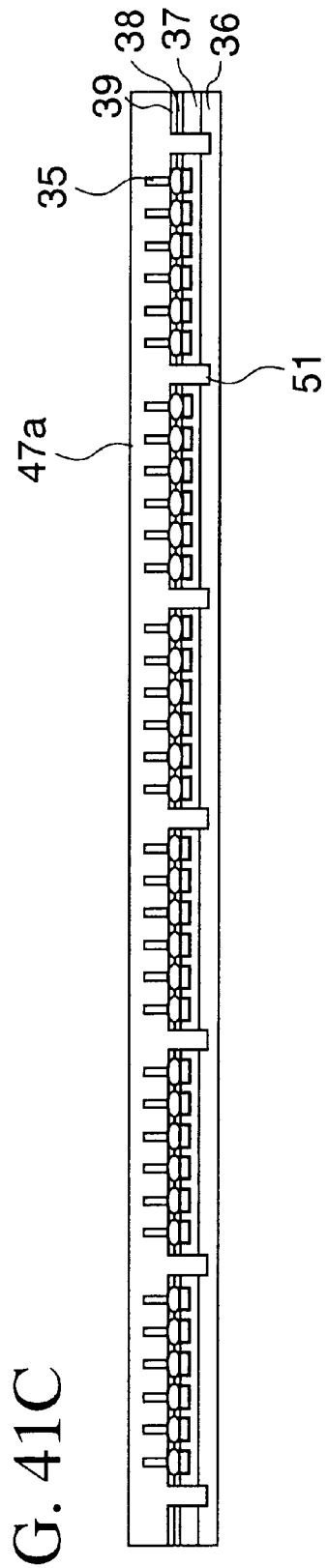

EXTERNAL CONNECTION TERMINAL AND SEMICONDUCTOR DEVICE

BACKGROUND OF THE INVENTION

1. Field of the Invention

The present invention relates to an external connection terminal and a semiconductor device and, more particularly, to an external connection terminal used in the semiconductor device, the electronic parts, the wiring substrate, the package, etc. and a semiconductor device having projection-like connection terminals.

2. Description of the Prior Art

Solder is employed to connect electrically and mechanically the semiconductor device to the ceramic substrate or to connect electrically and mechanically the electronic parts to the wiring substrate.

For example, the solder is formed on the metal wiring like a ball, or is coated on the metal wiring by screen printing, and then is jointed to the metal wiring by heating/melting. Normally the metal wiring is formed of metal containing a large amount of aluminum (Al) or copper (Cu).

When the solder is jointed to the surface of the metal wiring, normally the nickel (Ni) layer is formed as the diffusion barrier metal (barrier metal) layer between the solder and the metal wiring, for the purpose of preventing the mutual diffusion the constituent element of the metal wiring and the tin (Sn) in the solder. As a method of forming the nickel layer, the employment of the electroless plating method without the feeding terminal is advantageous to shorten the film forming steps and to suppress cost. Also, in order to improve the wettability of the solder, sometimes the gold layer is formed on the nickel layer.

The state before the solder is jointed to the metal wiring on which the nickel layer and the gold layer are formed is shown in FIG. 1, for example. In FIG. 1, the nickel (Ni) layer 103 and the gold (Au) layer 104 are formed on a part of the surface of the metal wiring 102 on the insulating film 101 by the electroless plating method, and the tin alloy solder 105 is placed thereon.

Also, Patent Application Publication (KOKAI) 2000-133739 discloses forming another solder layer made of the material, that has a melting point higher than the tin alloy solder and contains an amount of tin less than the tin alloy solder, on the gold layer 104 by the electroless plating method, etc., before the formation of the tin alloy solder 105.

As another structure of the solder layer and the metal wiring, Patent Application Publication (KOKAI) 2000-22027 discloses forming the nickel plating layer, the palladium plating layer, and the gold plating layer in order on the wiring.

Also, sometimes the gold film is employed in place of the tin alloy solder layer. As the barrier metal film between the gold film and the wiring, it is set forth in Patent Application Publication (KOKAI) Hei 3-209725, for example, to form the nickel film by the electroless plating method.

In addition, as the layer structure of the wiring and the solder layer, various structures have been known.

For example, Patent Application Publication (KOKAD) Hei 9-8438 discloses forming the electroless nickel plating film, the substitutional palladium film, the electroless palladium plating film, the substitutional gold plating film, and the electroless gold plating film in sequence on the surface of the wire bonding terminal.

In Patent Application Publication (KOKAl) Hei 5-299534, the structure in which the first layer made of the electroless nickel plating film, the second layer made of the electroless nickel-boron plating film or the electroless nickel-phosphorus plating film, and the third layer made of the palladium film or the palladium alloy film are formed in sequence on the metal outer ring is set forth as the stem to be soldered. Here the palladium film or the palladium alloy film is formed to improve the wettability of the solder.

Meanwhile, the conductive pins used as the external connection terminals of the semiconductor device are set forth in Patent Application Publication (KOHYO) Hei 9-505439, for example. The surface of the semiconductor device on the conductive pin forming side is covered with the plastic package. Also, the projection electrodes used as the external connection terminals of the semiconductor device are set forth in Patent Application Publication (KOKAI) Hei 5-55278, for example. A real chip size of the semiconductor device on which the conductive pins and the projection electrodes are formed can be achieved.

As described above, the nickel film or the nickel alloy film is formed on the surface of the wiring, the pin, or the stem to which the solder is jointed, and then the layer having a single layer structure or the multi-layered structure made of gold, palladium, or the like is formed thereon.

However, according to such structure, after the solder is jointed to the wiring, the pin, or the stem by the heating/melting, such solder is easily peeled off from the wiring, the pin, or the stem by the external impact, etc.

Patent Application Publication (KOKAI) 2000-133739 discloses that, as the cause of such peeling-off, the concentration of the phosphorus contained in the nickel layer, that is formed by the electroless plating, is increased at the time of melting the solder.

By the way, in the external connection terminals formed on the package of the semiconductor device or on the semiconductor device, there are following respects to be improved.

For example, Patent Application Publication (KOKAI) Hei 5-55278 and Patent Application Publication (KOHYO) Hei 9-505439 both disclose, in the semiconductor device which is miniaturized to the same size as the chip, the capability of relaxing the thermal stress is lowered rather than the package in the prior art and thus the stress tends to concentrate to the external connection terminal packaging portion.

In the semiconductor device set forth in Patent Application Publication (KOKAI) Hei 5-55278, the plastic sealing is formed only on one surface of the silicon chip, and side surfaces and the back surface of the silicon chip are exposed. Because silicon is very fragile, there is a possibility that, if the silicon chip is thinned more and more, the circuits formed in the chip are damaged by the silicon chipped off from the exposed surface side.

That is, in the package which is miniaturized to the same size as the chip, there is a possibility that the chipping or the crack on the back surface or the side surfaces causes the damage of the circuits and thus yield of the fabrication is lowered.

Patent Application Publication (KOHYO) Hei 9-505439 aims at improvement of the packaging reliability by forming the electrode on the metal pad by using the deformable metal wire. This electrode can be formed by the normal wire bonder method, but the formation tact needs the time that is several times the normal bonding and also needs much production cost. Also, the electrode made of the metal wiring is covered with the metal shell formed by the electrolytic plating method. In this case, if the electrolytic plating is applied in the situation that the wiring patterns connected to the metal wiring are exposed, the distribution of the film thickness of the metal shell is largely affected by the distribution of the current density in the electrolytic plating. Thus, because it is difficult to obtain sufficient and uniform thickness, it is difficult to achieve the fine pitch of the electrode made of the metal wire. In addition, if the metal shell is formed by an electrolytic plating method and then the wirings are formed by etching the metal film, migration of the wiring material becomes a concern.

Also, Patent Application Publication (KOHYO) Hei 9-505439 discloses that pin-like metal wires are covered with a nickel layer and a gold layer and then the metal wires are connected to the external devices by solder. In this case, if the nickel layer is formed by the electroless plating method, there is a possibility that crack is created between the solder and the metal wire, as described above.

SUMMARY OF THE INVENTION

It is an object of the present invention to provide an external connection terminal having a new joint layer structure that can improve the adhesiveness between the metal pattern used as the electrode, the wiring, or the pad and the solder.

Also, it is another object of the present invention to provide a semiconductor device that can achieve the improvement of yield.

According to the present invention, the external connection terminals are constructed by forming the phosphorus-containing or boron-containing nickel layer, the rich phosphorus-containing or rich boron-containing nickel layer that contains the phosphorus or the boron higher than this phosphorus-containing or boron-containing nickel layer, the nickel-tin ally layer, the tin-rich tin alloy layer, and the tin alloy solder layer in sequence on the electrode.

Also, according to the present invention, the external connection terminals are constructed by forming the phosphorus-containing or boron-containing nickel-copper layer, the rich phosphorus-containing or rich boron-containing nickel-copper layer that contains the phosphorus or the boron higher than this phosphorus-containing or boron-containing nickel-copper layer, the nickel-copper-tin ally layer, and the tin alloy solder layer in sequence on the electrode.

According to such external connection terminals, after the tin alloy solder layer is heated/melted to exceed the melting point, a Kirkendall void to weaken the external connection terminal is not generated. Therefore, the adhesiveness between respective layers can be improved and thus the reliability of the external connection terminals can be enhanced.

Also, according to the present invention, in the chip-like semiconductor device having the projection-like electrodes, the coating film made of organic insulating material or metal is formed on at least one of the back surface and the side surfaces of the semiconductor substrate. Therefore, it is difficult for chipping or cracking to occur on the back surface and the sides surfaces of the semiconductor substrate, and, thus, the yield of the semiconductor devices can be improved by preventing the damage of the semiconductor circuits.

In addition, because the metal patterns to which the external connection terminals are connected are covered with the organic insulating film having the low hygroscopic degree, generation of the migration of the metal patterns can be prevented and thus the reliability of the package can be improved. Also, because any one of copper, aluminum, and gold is employed as the electrodes and the wirings, the semiconductor devices in which the electrodes and the wirings are excellent in electric conduction and heat radiation can be formed at low cost by the existing equipment.

Further, because the external connection terminals are formed like a rod such as the circular cylinder, the polygonal column, etc., the length can be enlarged not to extend the interval between the external connection terminals, and, thus, a fine pitch of the external connection terminals can be achieved.

Besides, because the external connection terminals are formed in a straight line, the external connection terminals can be formed at the short tact by the existing equipment in executing the wire bonding.

With the above, the possibility of the migration of the wiring material is wiped away and also the fine pitch between the projection-like electrodes is achieved.

BRIEF DESCRIPTION OF THE DRAWINGS

FIGS. 20A to 20F are sectional views showing steps of forming the first semiconductor device according to the second embodiment of the present invention;

DESCRIPTION OF THE PREFERRED EMBODIMENTS

First Embodiment

First, analyzed results obtained after the nickel-phosphorus layer and the tin alloy solder layer formed in sequence on the uppermost metal wiring or metal pad of the semiconductor device are jointed is explained hereunder.

Figure 1:
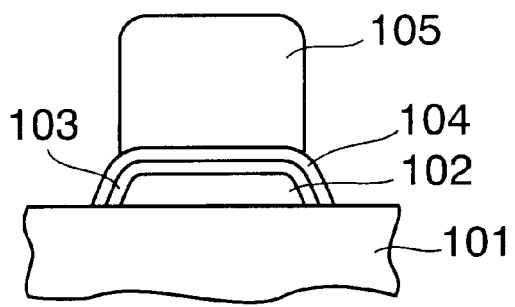
FIG. 1 is a sectional view showing a structure of a first connection terminal in the prior art.
Figure 2A:
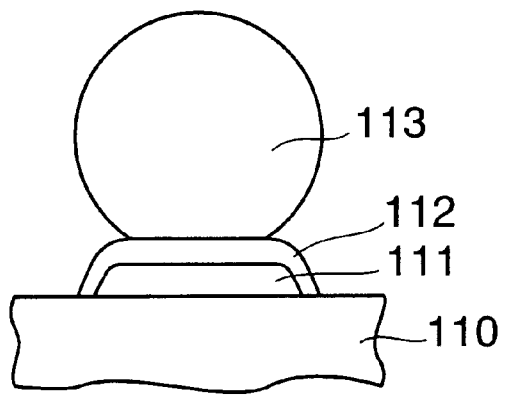
FIGS. 2A and 2B are sectional views showing steps of forming the first connection terminal in the prior art.

FIG. 2A is a sectional view showing the structure in the prior art immediately before the solder is jointed to the wiring on the semiconductor device.

In FIG. 2A, a wiring 111 made of copper or aluminum is formed on an insulating film 110, then a nickel-phosphorus (NiP) layer 112 is formed on a part of the wiring 111 by an electroless plating method, and then an eutectic tin-lead (SnPb) solder layer 113 is mounted thereon. The nickel-phosphorus layer 112 is formed as a barrier layer because the phosphorus contained in the phosphinic acid as the reducing agent for the electroless plating is introduced into the nickel layer. The phosphorus concentration in the nickel-phosphorus layer 112 is 8 to 15 wt %.

Figure 2B:
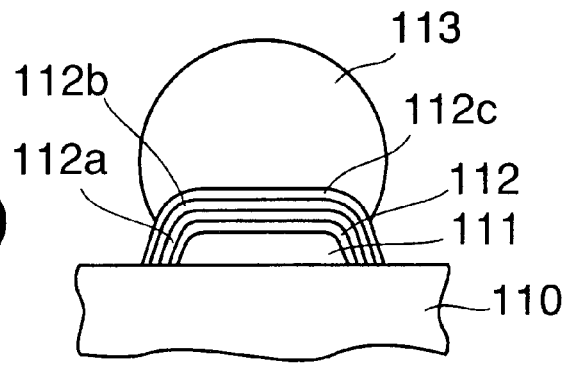
Figure 3:
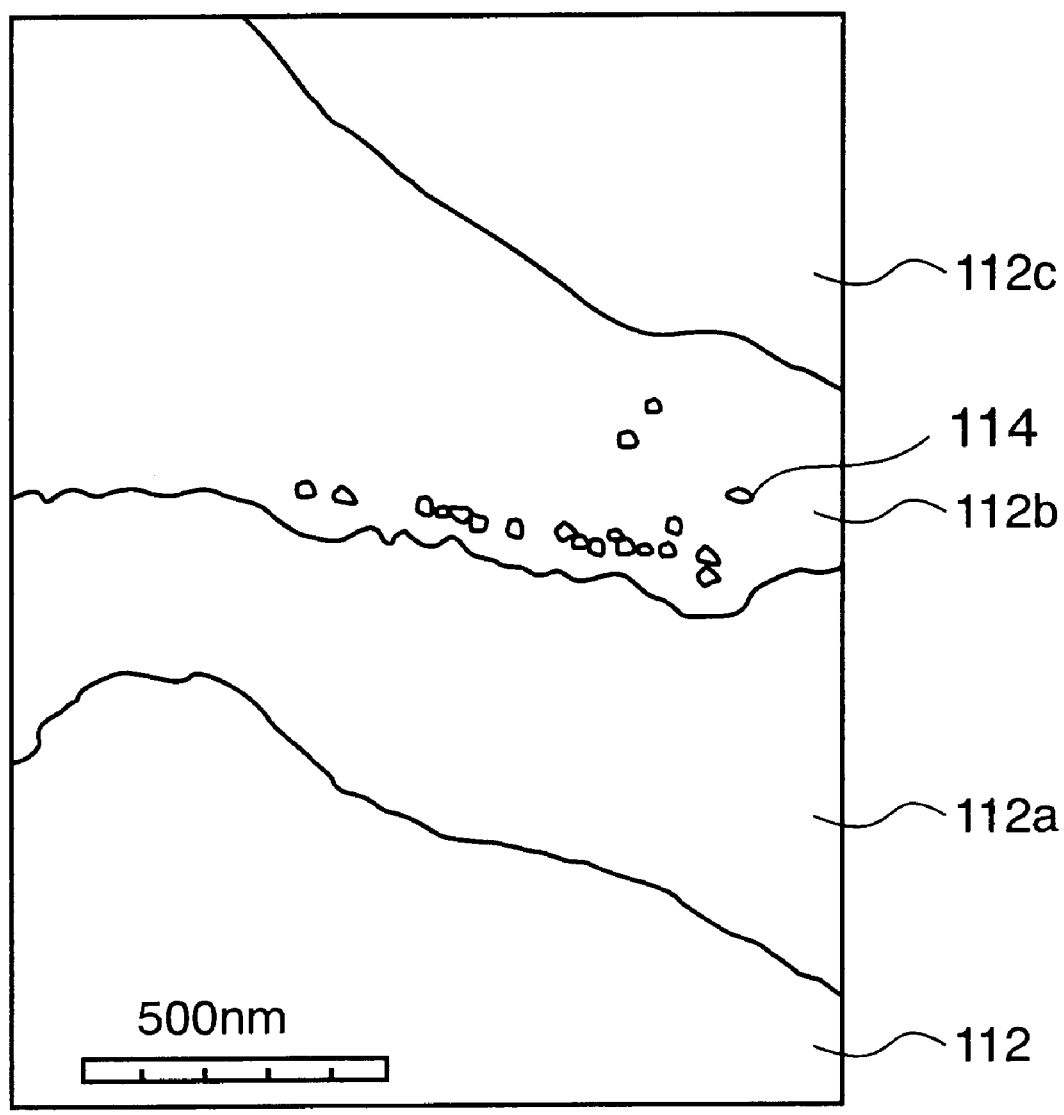
FIG. 3 is a sectional view showing a layer structure of the first connection terminal in the prior art after heating.

In such state, after the solder layer 113 is melted/heated and then cooled, a layer structure shown in FIG. 3 is confirmed when a sectional shape of the interface between the NiP layer 112 and the solder layer 113 is taken as in an SEM microphotograph. That is, it becomes apparent that the structure shown in FIG. 2A is changed into the structure shown in FIG. 2B by solder heating. In this case, FIG. 3 is depicted based on the TEM microphotograph.

In FIG. 2B, a rich phosphorus containing NiP layer (referred to as "rich P—Ni layer" hereinafter) 112a, an NiSnP layer 112b, an NiSn layer 112c, and the tin alloy solder layer 113 are formed in sequence on the NiP layer 112 by the heating/melting, and dot-like voids 114 are formed in the NiSnP layer 112b, as shown in FIG. 3. The heated/melted solder layer 113, as well as the wiring 111, is used as the external connection terminal.

The reason that the change occurs in the interface between the solder layer 113 and the NiP layer 112 by the heating will be given as follows.

When the solder layer 113 is melted, the rich P—Ni layer and the NiSn layer 112c are grown between the solder layer 113 and the NiP layer 112 as a result of the mutual diffusion of the tin and the nickel, and simultaneously the NiSnP layer 112b is formed between the rich P—Ni layer 112a and the NiSn layer 112c. When the heating is continued further, the nickel in the NiSnP layer 112b is diffused into the solder layer 113 by the Kirkendall effect to accelerate the growth of the NiSn layer 112c and also to generate a void (referred to as "Kirkendall void" hereinafter) 114 in the NiSnP layer 112b. It was confirmed by the inventors of the present invention that, when the solder layer 113 is jointed to the wiring 111 and then such solder layer 113 is again heated/melted, such phenomenon is also caused.

In this case, the rich P—Ni layer 112a is formed in the area of the NiP layer 112 that is close to the solder layer 113. Because the nickel in the NiP layer 112 is diffused into the solder layer 113 to increase the phosphorus concentration, this rich P—Ni layer 112a is formed. The phosphorus concentration in the rich P—Ni layer 112a is 15 to 25 wt %.

Figure 4:
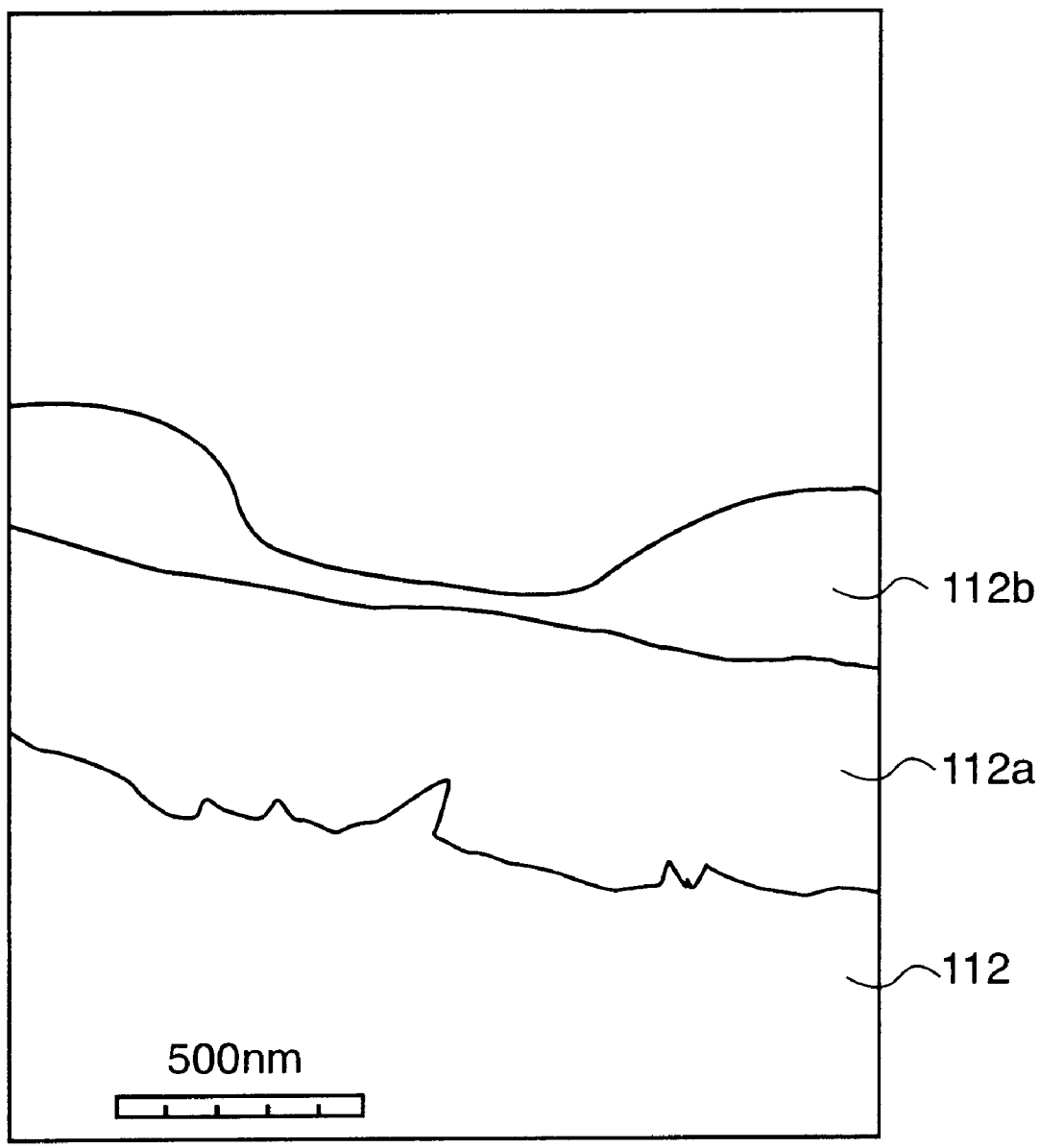
FIG. 4 is a sectional view showing a layer structure of the first connection terminal in the prior art in a situation in which the solder is peeled off after heating.

Then, the connection terminal having the structure shown in FIG. 2B is formed on the ceramic substrate, and is then jointed to the wiring on the semiconductor device (not shown) by heating/melting the solder layer 113 once again. Then, when the drop test of the ceramic substrate is executed, the connection terminal is destroyed and, thus, the solder layer 113 is peeled off from the wiring 111. When a sectional shape of the layer structure on the wiring 111 is taken as the SEM microphotograph after the peeling-off of the solder layer 113 is caused, the solder layer 113 and the NiSn layer 112c are peeled off from the wiring 111, as shown in FIG. 4, and thus the NiSnP layer 112b is exposed.

In order to suppress such peeling-off of the solder layer 113, it may be considered that the semiconductor device and the ceramic substrate are jointed to each other by filling the underfill between them. In this case, there are drawbacks such that the production cost is increased and also the semiconductor device on the ceramic substrate cannot be exchanged if the defective joint of the connection terminal is found by the later test.

Figure 5A:
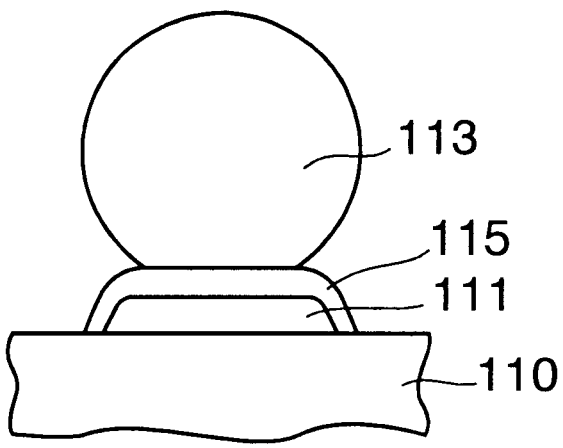
FIGS. 5A and 5B are sectional views showing steps of forming a second connection terminal in the prior art.
Figure 5B:
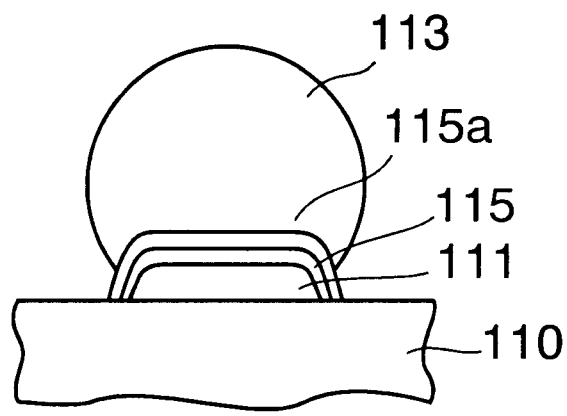

As shown in FIG. 5A, a Pd (palladium) layer 115 of 2 µm thickness is formed on the wiring 111 made of copper or aluminum by the electroless plating method, and then the tin-lead (SnPb) solder layer 113 is formed thereon. Then, when the solder layer 113 is heated/melted, the structure shown in FIG. 5B is obtained. In FIG. 5B, it was confirmed by an experiment made by the inventors that a large amount of the PdSn alloy layer 115a is grown at the interface between the Pd layer 115 and the SnPb solder layer 113 by the heating and then the Kirkendall voids are generated in the PdSn alloy layer 115a, so that the solder layer 113 is easily peeled off.

Data regarding the strength of the external connection terminal obtained by jointing the Pd layer 115 and the SnPb solder layer 113 are not recited in at least the above well-known references set forth in the prior art column.

In order to improve the joint strength between the NiP layer and the Sn alloy solder layer, the inventors consider based on the above analyzed results to employ following structures as the joint terminal formed on the semiconductor device, the circuit substrate, the electronic parts, etc.

In a first structure, a structure for preventing the Sn in the Sn alloy solder layer from diffusing excessively into the NiP layer is employed to suppress the growth of the rich P—Ni layer.

In a second structure, a structure for not-forming the NiSnP layer at the interface between the NiP layer and the NiSn layer is employed to suppress the generation of the Kirkendall voids.

In order to obtain such structures, the inventors formed the external connection terminals, that have structures shown in following (i) to (iii), on the wiring.

(i) First External Connection Terminal

The first external connection terminal on the metal pattern acting as the wiring, the pad, etc. is formed as follows, for example.

Figure 6A:
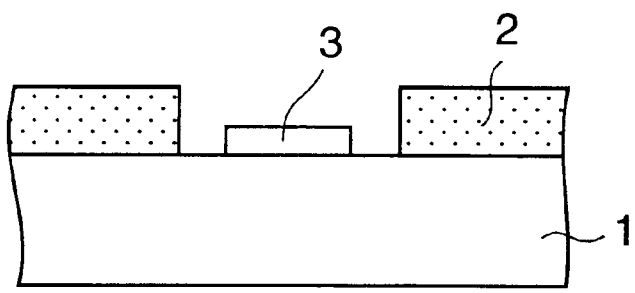
FIGS. 6A to 6F are sectional views showing steps of forming a first external connection terminal according to a first embodiment of the present invention.

First, as shown in FIG. 6A, a ceramic (insulating) substrate 1, on an upper surface of which a wiring 3 is formed, is covered with resist 2 except the solder jointing area of the wiring 3.

Figure 6B:
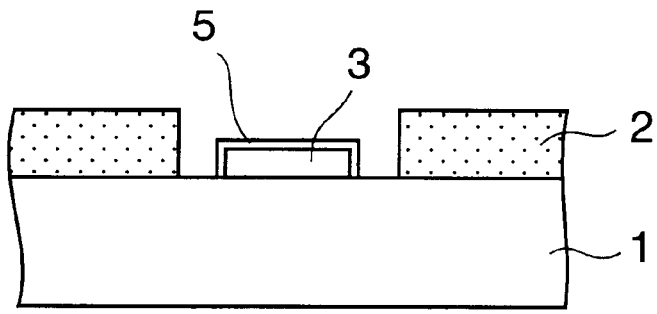

Then, as shown in FIG. 6B, a NiP layer 5 of about 2 µm thickness is formed on the wiring (electrode) 3 made of the alloy, that contains aluminum, copper, or any one of them as a principal component, as a barrier metal layer by an electroless plating method. As the plating liquid used to form the NiP layer 5, a phosphinic acid, Linden SA (product name: manufactured by World Metal Co., Ltd.), or the like, for example, is employed. The phosphorus concentration in the NiP layer 5 is 1 to 15 wt %.

Figure 6C:
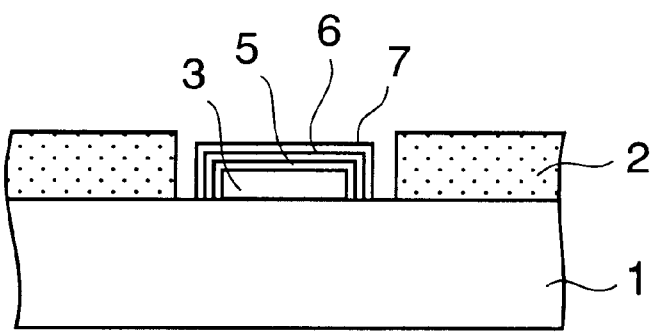

Then, as shown in FIG. 6C, a palladium (Pd) layer 6 of less than 200 nm thickness and a gold (Au) layer 7 of less than 100 nm thickness are formed on the NiP layer 5 by the electroless plating method, respectively. As a plating liquid used to form the Pd layer 6, Linden PD (product name: manufactured by World Metal Co., Ltd.), for example, is employed. Also, as a plating liquid used to form the Au layer 7, Aurolectroless SMT-210 (product name: manufactured by Lea Ronal Japan Inc.), for example, is employed.

The Au layer 7 is formed to improve the wettability of the solder in melting the solder, and the Pd layer 6 is formed to prevent the oxidation of the NiP layer 5.

Figure 6D:
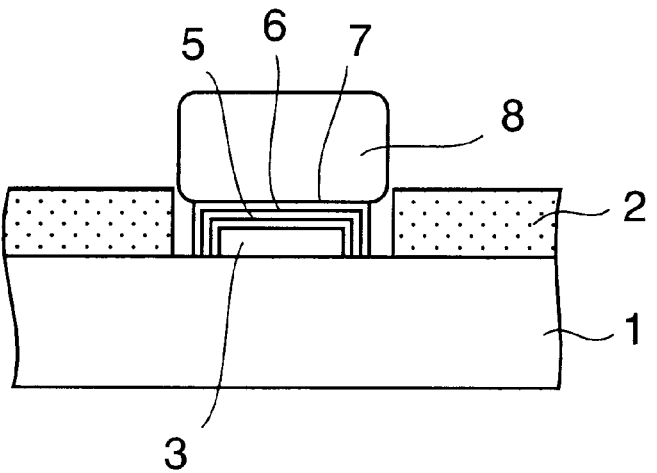

Then, as shown in FIG. 6D, a tin alloy solder layer 8 such as tin-lead (SnPb) solder, tin-silver-copper (SnAgCu) solder, etc., containing Sn by at least more than 5 wt % is formed on the Au layer 7. The tin alloy solder layer 8 may be formed of an SnBi layer containing bismuth (Bi) by 4%. When the tin alloy solder layer 8 is formed, a method such as a screen printing method, a ball mounting method, etc., using solder paste is employed.

After this, the solder layer 8 is heated/melted to the wiring 3 via the NiP layer 5, the Pd layer 6, and the Au layer 7. It is preferable that the conditions should be selected in this case such that the heating temperature is set to more than the melting point of the solder layer 8 and the heating time is set to be less than 20 minutes.

Unless the Au layer 7 and the Pd layer 6 are interposed between the solder layer 8 and the NiP layer 5, the solder layer 8 can be jointed to the NiP layer 5 at a temperature less than the melting point of the solder. In contrast, if the Au layer 7 and the Pd layer 6 are interposed between the solder layer 8 and the NiP layer 5, the solder layer 8 is not sufficiently wetted and spread on the NiP layer 5 when the solder layer 8 is not melted at the temperature of more than the melting point of the solder.

Figure 6E:
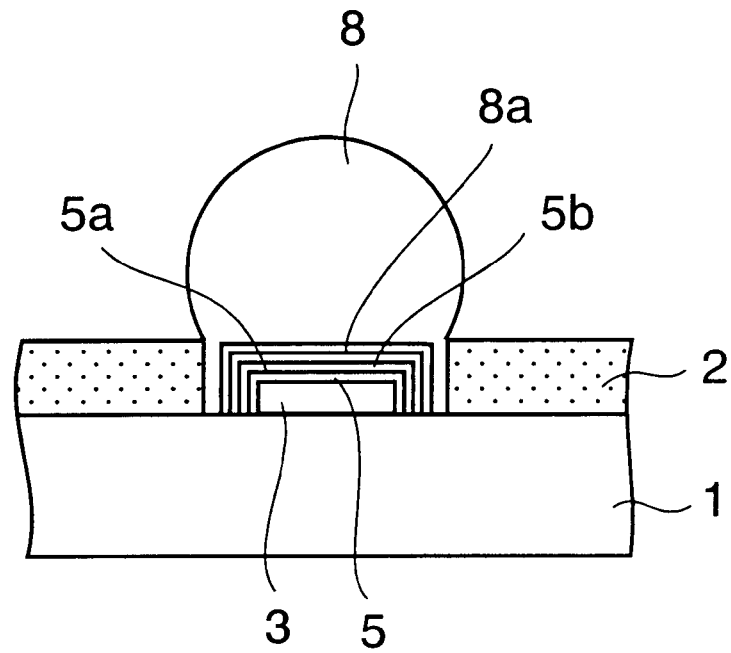
Figure 7:
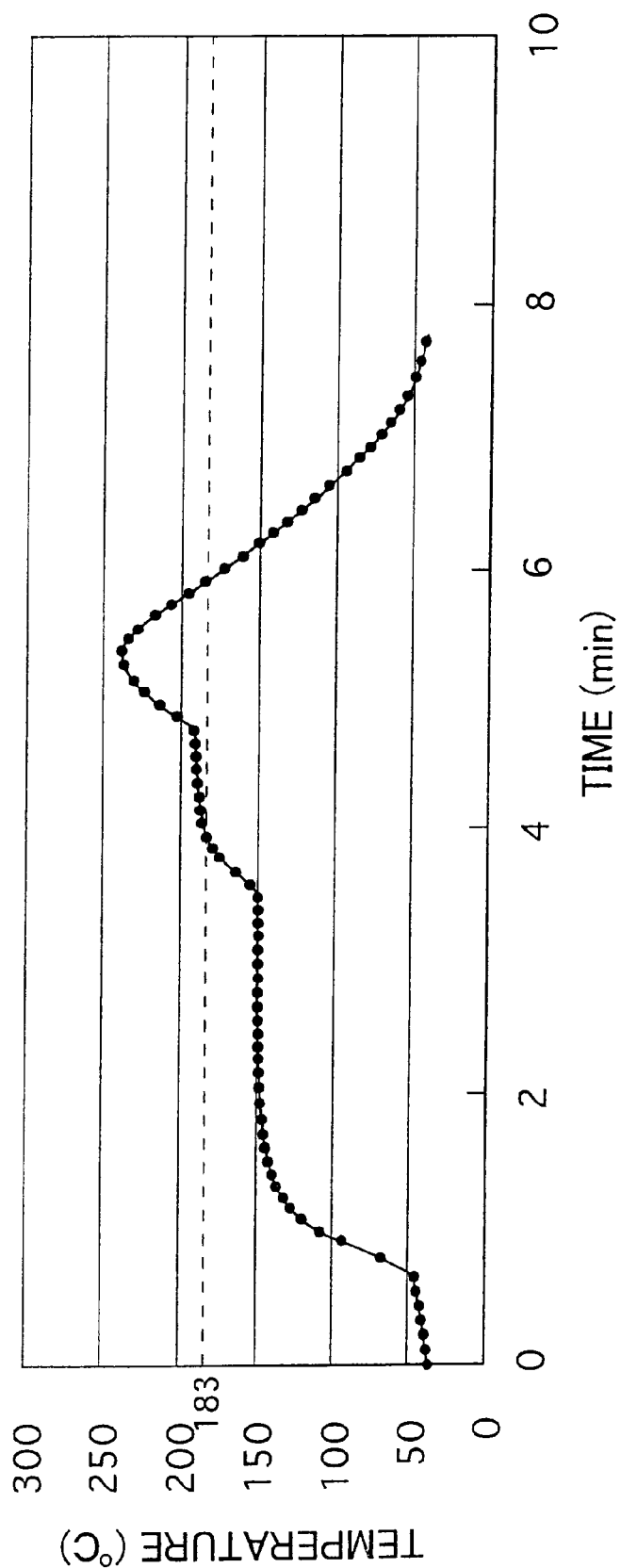
FIG. 7 is a view showing a forming temperature profile for solder interface alloys in the first external connection terminal according to the first embodiment of the present invention.

When the solder layer 8 is controlled based on the time/temperature profile shown in FIG. 7, a structure of the solder layer 8 on the wiring 3 is shown in FIG. 6E.

In the temperature profile shown in FIG. 7, the solder layer 8 is maintained at a temperature of more than the melting point for almost two minutes and the peak temperature is set to less than 250° C. at that time. In this example, the solder layer 8 is formed of autectic tin-lead, and the melting point of the solder layer 8 is 183° C.

In FIG. 6E, the NiP layer 5 of 1400 to 1600 nm thickness, a rich P—Ni layer 5a of 50 to 300 nm thickness, a NiSn layer 5b of 2000 to 4000 nm thickness, a Sn-rich SnPd layer (also referred to as a rich Sn—Pd layer hereinafter) 8a of 10 to 200 nm thickness, and the solder layer 8 are present in sequence on the wiring 3. The phosphorus concentration in the rich P—Ni layer 5a is 15 to 25 wt %, the tin concentration in the rich Sn—Pd layer 8a is 50 to 70 wt %, and the tin concentration in the NiSn layer 5b is less than 52 wt %. In this case, the layer structure between the solder layer 8 and the wiring 3 is also called an underlying metal layer hereunder.

The thin rich Sn—Pd layer 8a blocks the alloying of Ni and Sn. Accordingly, an NiSnP layer is not formed between the rich P—Ni layer 5a and the NiSn layer 5b, and, in addition, the NiSnP layer is not formed even when the heating/melting of the solder layer 8 is repeated.

By the way, if the Pd layer 6 on the NiP layer 5 shown in FIG. 6C is formed to be thicker than 200 nm, the Kirkendall voids are easily generated between the solder layer 8 and the NiP layer 5 and also the SnPd layer is formed thick, and, thus, such thickness is not preferable. In contrast, if the Pd layer 6 is formed to have a thickness of less than 200 nm, the rich Sn—Pd layer 8a is formed extremely thin and, thus, the Kirkendall voids are not generated in the rich Sn—Pd layer 8a.

Also, if the Au layer 7 becomes thicker than 100 nm, the AuSn alloy having the weak mechanical strength is formed between the solder layer 8 and the NiP layer 5. In contrast, if the Au layer 7 becomes thinner than 100 nm, such Au layer 7 is eliminated because all elements in the Au layer 7 are diffused into the solder layer 8 when the solder layer 8 is heated/melted. Because Au and Pd are contained in the solder layer 8 as the solid solution of the low concentration, respectively, they never exert a bad influence upon the solder strength.

Figure 8:
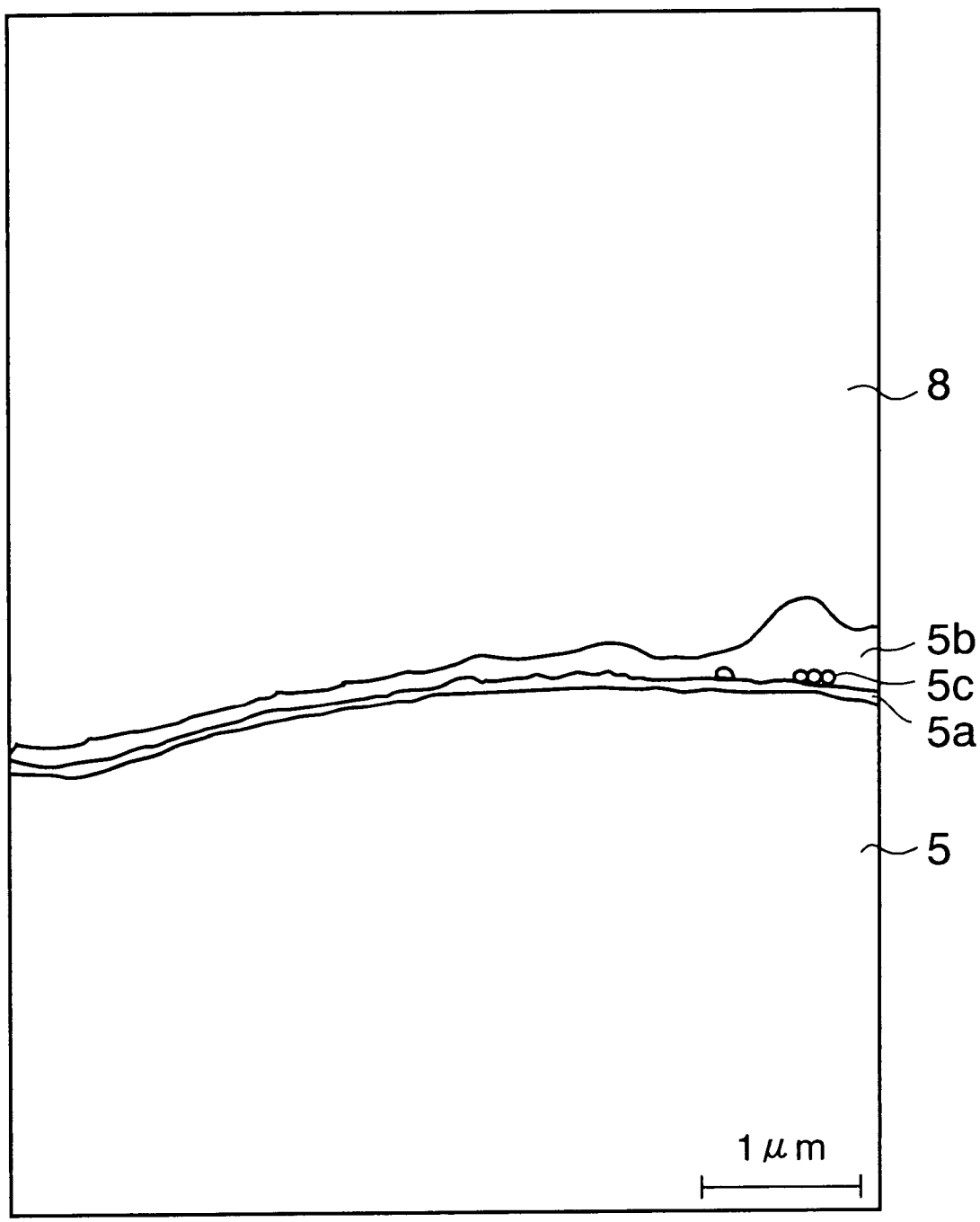
FIG. 8 is a sectional view showing a layer structure on the wiring in the first external connection terminal according to the first embodiment of the present invention when the excessive heating time is employed.

If the heating time is too long when the solder layer 8 is heated at the temperature of more than the melting point, NiSn crystal grains 5c are generated in the NiSn layer 5b formed between the solder layer 8 and the NiP layer 5, as shown in FIG. 8, and also such NiSn crystal grains 5c spread into the solder layer 8 like a needle. The needle-shaped NiSn crystal grains 5c weaken the strength of the interface between the solder layer 8 and the wiring 3, causing a degradation in the share strength of the connection terminal 10.

Figure 6F:
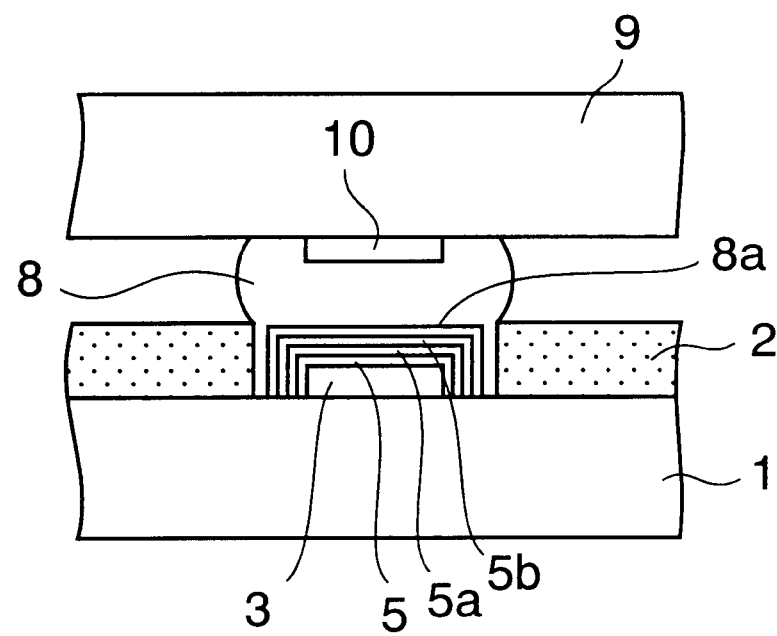

Accordingly, it is suitable that the heating of the solder layer 8 is executed to be short for 2 to 10 minutes, for example, at a temperature of more than the melting point. Such heating conditions may be applied to not only the step of jointing the solder layer 8 to the wiring 3 but also to the step of jointing the solder layer 8 to the wiring 10 on other substrate 9, as shown in FIG. 6F.

Figure 9:
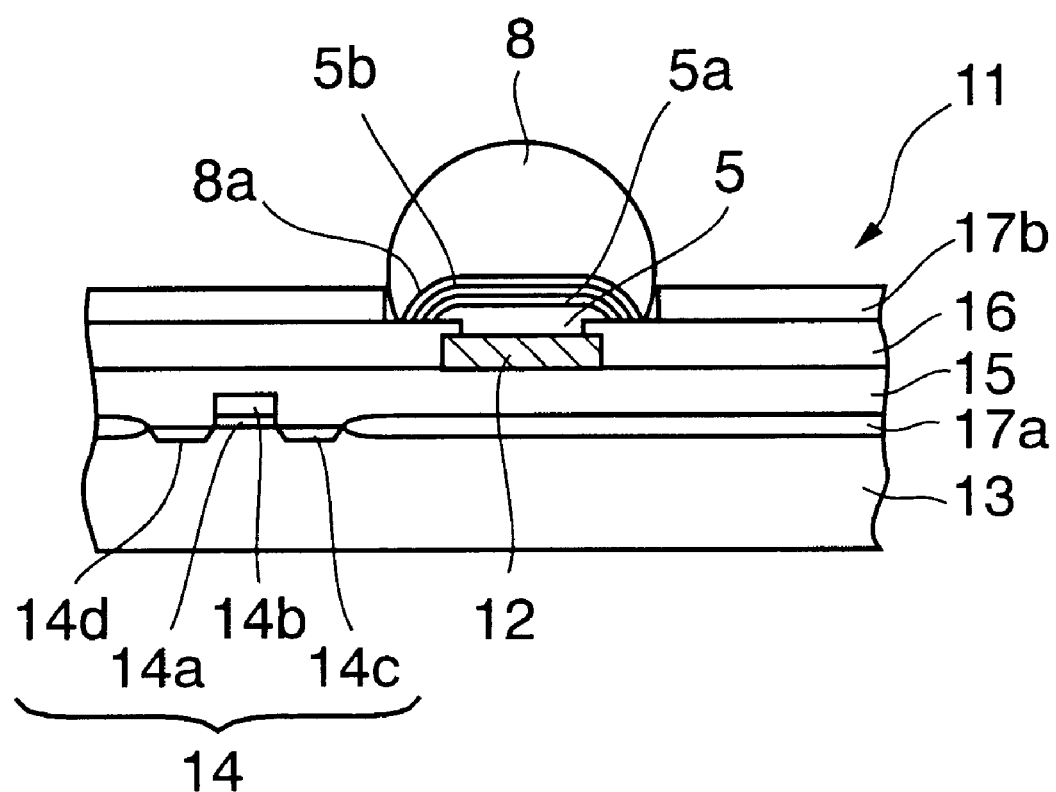
FIG. 9 is a sectional view showing a semiconductor device having the first external connection terminal according to the first embodiment of the present invention.

As shown in FIG. 9, the above connection terminal may be formed on the metal pattern 12 constituting the uppermost wiring or pad of a semiconductor device 11. In FIG. 9, a gate electrode 14b is formed on a semiconductor (silicon) substrate 13 via a gate insulating film 14a, and impurity diffusion layers 14c, 14d are formed in the semiconductor substrate 13 on both sides of the gate electrode 14b. An MOS transistor 14 consists of the gate electrode 14b, the impurity diffusion layers 14c, 14d, etc. Also, an interlayer insulating film 15 having a single layer or multi-layered wiring structure to cover the MOS transistor 14 is formed on the semiconductor substrate 13. A metal pattern 12 as the wiring or the pad that is covered with an inorganic insulating film 16 such as a silicon oxide film, a silicon nitride film, etc., is formed. The underlying metal film having the same structure as FIG. 6E, i.e., the NiP layer 5, the rich P—Ni layer 5a, the NiSn layer 5b, and the Sn-rich Sn alloy layer 8a, is formed on the metal pattern 12 exposed from an opening in the inorganic insulating film 16, and also the Sn alloy solder layer 8 is formed on the underlying metal film.

A reference 17a in FIG. 9 denotes a field insulating film that surrounds the MOS transistor 14 on the surface of the semiconductor substrate 13, and a reference 17b denotes an organic insulating film that surrounds the solder joint area of the metal pattern 12.

(ii) Second External Connection Terminal

Figure 10A:
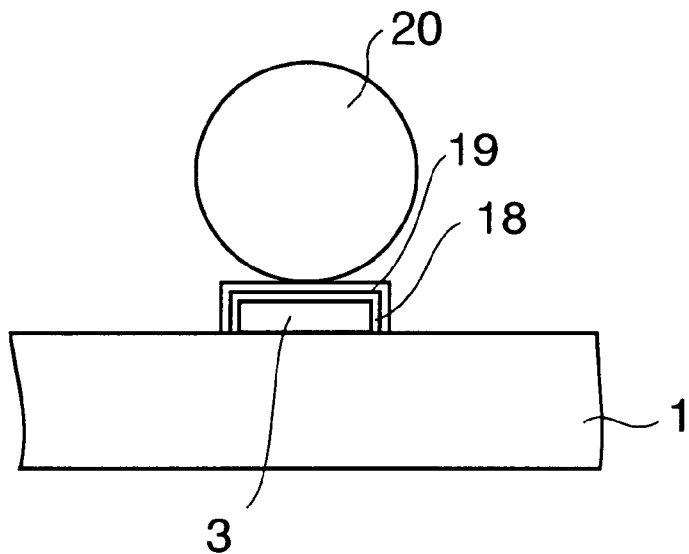
FIGS. 10A and 10B are sectional views showing steps of forming a second external connection terminal according to the first embodiment of the present invention.

In order to form a second external connection terminal on the substrate, as shown in FIG. 10A, a nickel-copper-phosphorus (NiCuP) layer 18 of 3000 nm thickness is formed on the wiring 3 by the electroless plating method, then a gold (Au) layer 19 of less than 100 nm thickness is formed thereon, and then a Sn alloy solder layer 20 containing Sn at more than 5 wt % is mounted on the Au layer 19. The phosphorus concentration in the NiCuP layer 18 is 1 to 15 wt %.

The formation of the NiCuP layer 18 is executed by using a plating liquid containing a copper sulfate 5 hydrate and a nickel sulfate 6 hydrate, or a plating liquid containing a copper source, a nickel source, a complexing agent, and a reducing agent, for example. Also, the Au layer 19 is formed by employing a plating liquid such as Aurolectroless SMT-210 (product name: manufactured by Lea Ronal Japan Inc.).

Figure 10B:
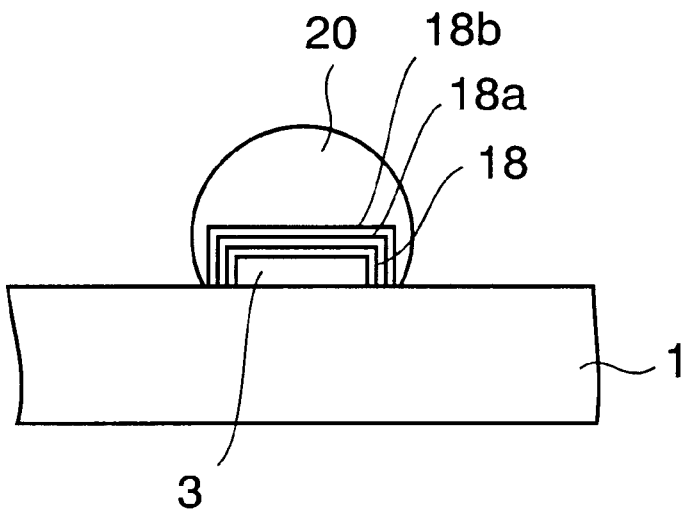

After this, when a solder layer 20 is melted and jointed to the wiring 3, a structure shown in FIG. 10B is obtained. More particularly, an NiCuP layer in which the concentration of phosphorus is increased (referred to as a "rich P—NiCu layer" hereinafter) 18a is formed on a surface of the NiCuP layer 18 to have a thickness of 10 to 15 nm, and a NiCuSn layer 18b of 100 to 300 nm thickness is formed by the diffusion of the copper and the nickel thereon. An amount of contained Sn in the NiCuSn layer 18b is less than 52 wt %. In this case, the Kirkendall effect is not caused and no void is generated between the solder layer 20 and the NiCuP layer 18. As a result, the solder layer 20 as the connection terminal formed on the wiring 3 becomes difficult to peel off from the wiring 3. Also, the gold layer 19 is diffused into the solder layer 20 by the heating and disappears.

In this case, a palladium layer (not shown) of less than 200 nm thickness may be formed between the gold layer 19 and the NiCuP layer 18.

Figure 11:
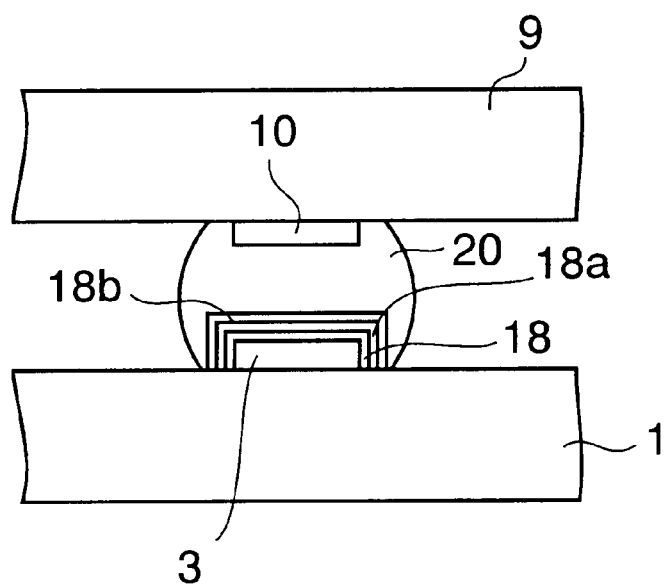
FIG. 11 is a sectional view showing a wiring-to-wiring connection state by the second external connection terminal according to the first embodiment of the present invention.

As shown in FIG. 11, for example, even if such connection terminal is connected to the wiring 10 on other substrate 9 by the heating/melting again, the layer structure is hardly changed and the destruction is not likely to occur.

Figure 12:
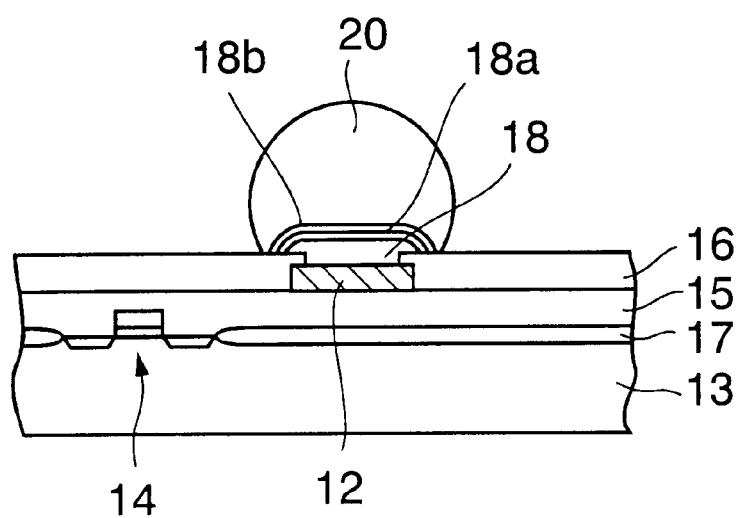
FIG. 12 is a sectional view showing a semiconductor device having the second external connection terminal according to the first embodiment of the present invention.

Further, as shown in FIG. 12, the connection terminal having the NiCuP layer 18, the rich P—NiCu layer 18a, the NiCuSn layer 18b, and the solder layer 20 may be formed on the uppermost metal pattern 12 of the semiconductor device 11.

(iii) Third External Connection Terminal

Figure 13A:
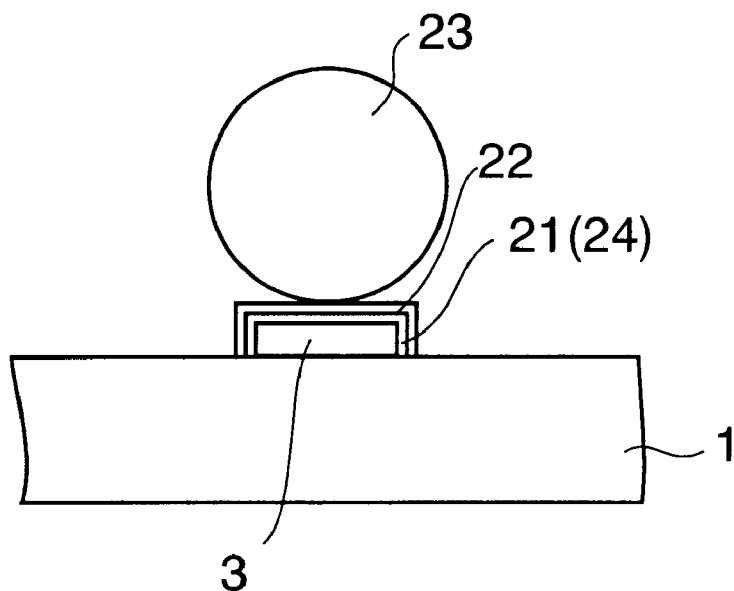
FIGS. 13A and 13B are sectional views showing steps of forming a third external connection terminal according to the first embodiment of the present invention.

In order to form a third external connection terminal on the substrate, as shown in FIG. 13A, a nickel phosphorus (NiP) layer 21 of 3000 nm thickness is formed on wiring 3 by the electroless plating method, then a gold (Au) layer 22 of less than 100 nm thickness is formed thereon by the electroless plating method, and then a copper-containing tin alloy solder layer 23 containing the tin (Sn) as a principal component and the copper (Cu) by 0.5%, e.g., a SnCuAg solder layer 23 is formed on the gold layer 22. An amount of contained tin in the SnCuAg solder layer 23 may be set to more than 5 wt %.

Figure 13B:
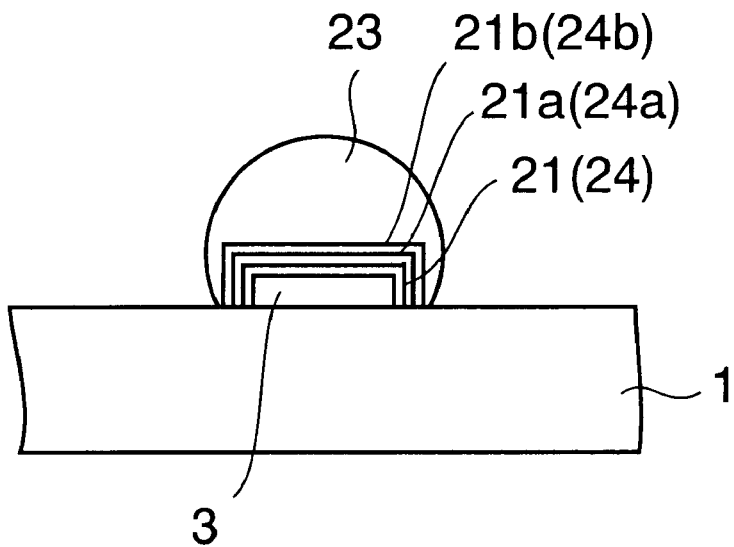

In turn, when the solder layer 23 is heated/melted and jointed to the wiring 3, a connection terminal having a structure, as shown in FIG. 13B, can be obtained. More particularly, a rich P—Ni layer 21 a in which the concentration of phosphorus is increased to be 15 to 25 wt % is formed on the NiP layer 21, and then an NiCuSn layer 21b is formed thereon as a result of the mutual diffusion of the copper and the nickel. An amount of contained Sn in the NiCuSn layer 21b is less than 52 wt %.

In this case, the Kirkendall voids are not present between the solder layer 23 and the NiP layer 21, and thus the solder layer 23 is difficult to peel off from the wiring.

The gold layer 22 is diffused into the solder layer 23 by heating and disappears.

In this case, a palladium layer (not shown) of less than 200 nm thickness may be formed between the gold layer 22 and the NiP layer 21.

Figure 14:
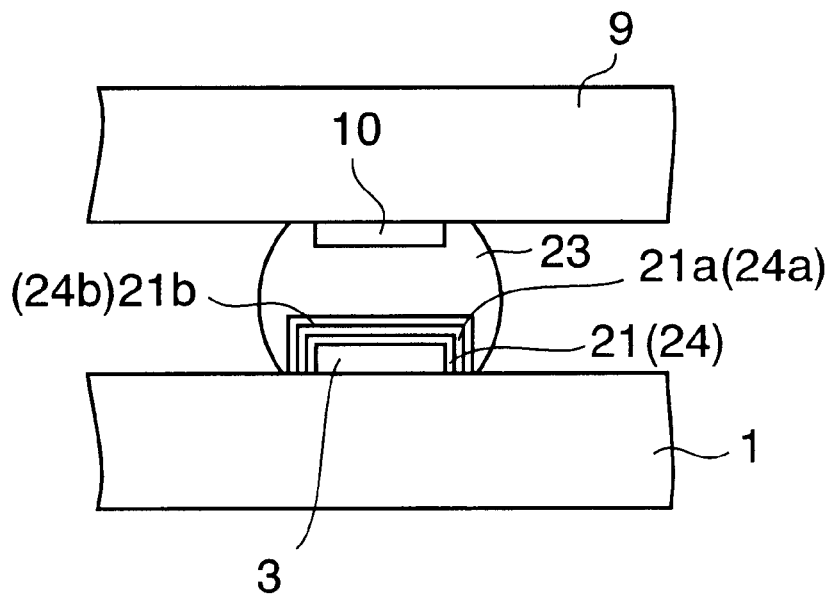
FIG. 14 is a sectional view showing a wiring-to-wiring connection state by the third external connection terminal according to the first embodiment of the present invention.

As shown in FIG. 14, for example, even if such connection terminal is connected to the wiring 10 on other substrate 9, the layer structure is seldom changed and the destruction does not occur.

Meanwhile, an NiCuP layer 24 containing phosphorus by 1 to 15 wt % may be formed by the electroless plating method in place of the NiP layer 21, shown in FIG. 13A. In this case, when the solder layer 23 is heated/melted, the connection terminal consisting of the NiCuP layer 24, the phosphorus-rich NiCuP (rich P—NiCu) layer 24a, the NiCuSn layer 24b, and the solder layer 23 is formed on the wiring 3, as shown in FIG. 13B. The amount of contained Sn in the NiCuSn layer 24b is less than 52 wt %.

In this case, no Kirkendall void is formed between the solder layer 23 and the NiCuP layer 24.

Figure 15:
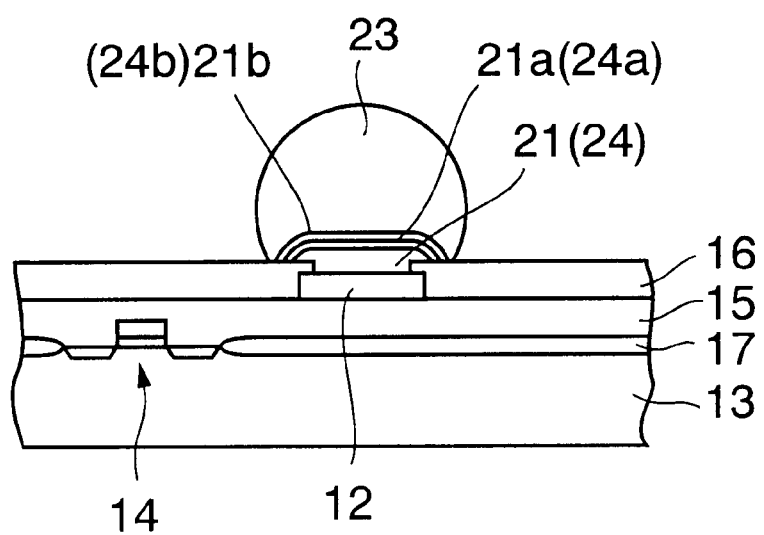
FIG. 15 is a sectional view showing a semiconductor device having the third external connection terminal according to the first embodiment of the present invention.

Here, as shown in FIG. 15, the above connection terminal may be formed on the uppermost metal pattern 12 of the semiconductor device 11.

According to the third external connection terminal having the above structure, because no lead is contained in the solder layer 23, no fumes are generated in the solder jointing, and also it is possible to say that such connection terminal is harmless and does not contaminate the environment when the ceramic substrate 1, the semiconductor device 11, etc., having such connection terminal are dumped. Further, the copper-containing tin alloy solder has a joint reliability that is equal to or greater than the eutectic tin-lead solder at the time of packaging the connection terminal.

When the drop test is executed after the wirings on two substrates are jointed via the connection terminals described in above (i) to (iii) and further the drop test is executed after the wirings on two substrates are jointed via the connection terminals having the conventional structure, results given in Table 1 were derived.

Accordingly, it becomes apparent that the solder joint can be improved by the connection terminals described in above (i) to (iii). In this case, the drop test is such a test that the resultant structure is dropped down from a height of 1 m by applying the load 300 g to one substrate in the situation that the wirings on two substrates are jointed via the connection terminals.

TABLE 1

| Sample structure | (A) | (B) | (C) | (D) |
|---|---|---|---|---|
| Drop test 1 time | 60% | 0% | 0% | 0% |
| Drop test 3 times | 100% | 0% | 0% | 0% |
| Drop test 5 times | 100% | 20% | 20% | 20% |

(A): Connection terminal in the prior art (the structure containing the NiSnP layer)
(B): First connection terminal (the structure containing the PdSn layer)
(C): Second connection terminal (the structure containing the NiCuP layer)
(D): Third connection terminal (the structure employing the CuSn alloy solder)

The NiP layer or the NiCuP layer is formed as the underlying metal layer between the metal pattern and the solder layer by electroless plating. However, if a liquid containing a Borane dimethylamine complex is employed as the plating liquid when the nickel layer is formed as the barrier metal, nickel boron (NiB) is formed on the metal pattern. In such case, the above structure and the manufacturing method may be employed. In this case, in the above structure, the NiP layer, the rich P—Ni layer, the rich P—NiCu layer, the NiSnP layer, and the NiCuP layer are replaced with the NiB layer, the rich B—Ni layer, the rich B—NiCu layer, the NiSnB layer, and the NiCuB layer respectively. Such layer structure may be applied to following embodiments.

In the present embodiment, the connection terminal in which the solder is jointed to the metal pattern, and the method of forming the same are explained. However, in following embodiments, to joint the solder layer to the surface of the projection-like electrode connected to the metal pattern will be explained hereunder.

Second Embodiment

Figure 16:
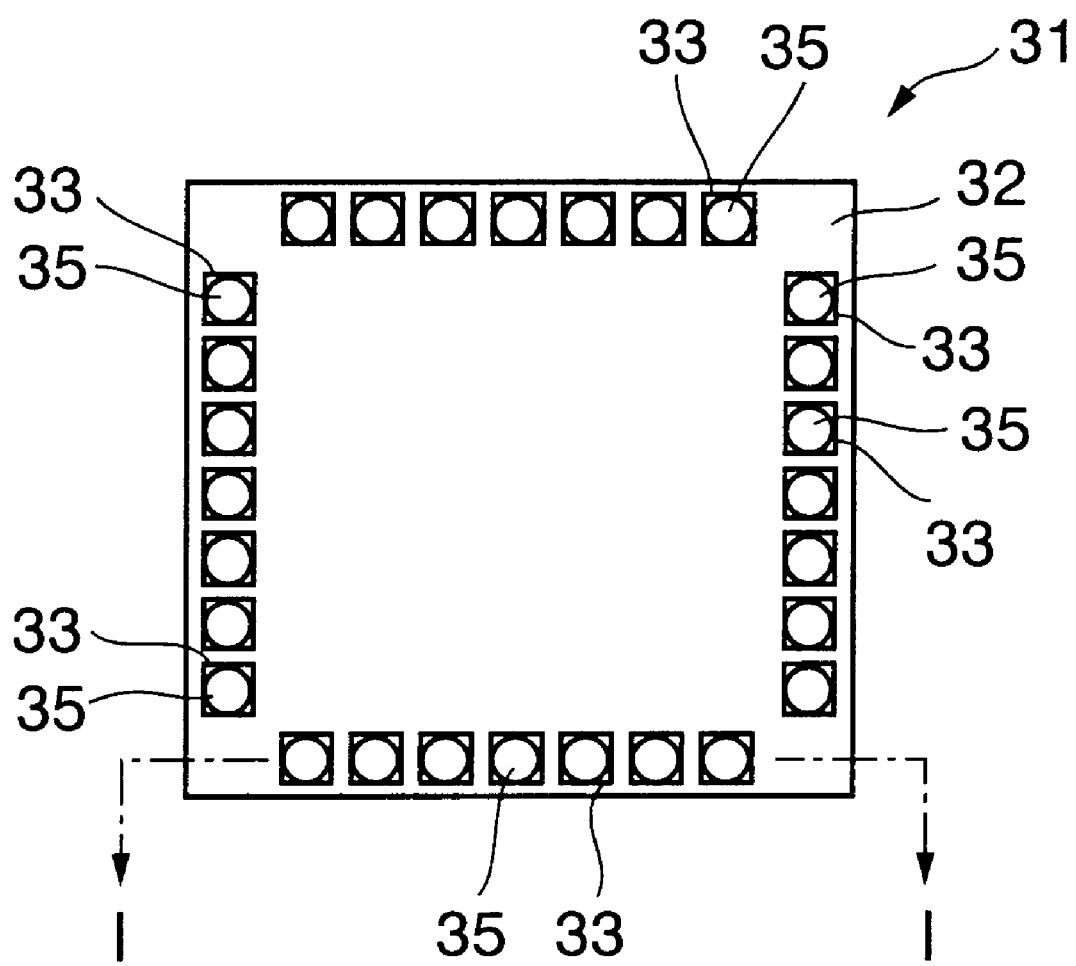
FIG. 16 is a plan view showing a first semiconductor device according to a second embodiment of the present invention.

FIG. 16 is a plan view showing a chip-like semiconductor device according to a second embodiment of the present invention.

In FIG. 16, a cover film 32 is formed on an uppermost surface of a semiconductor device 31 in which semiconductor elements and semiconductor circuits are formed, and a plurality of opening portions 33 are formed in the cover film 32 along its periphery. Metal pads (metal patterns) are formed under these opening portions 33, and wire-like or projection-like electrodes 35 that pass through the opening portions 33, respectively, are connected to the metal pads.

Several examples of a sectional structure taken along a I—I line in FIG. 16 will be explained hereunder.

Figure 17:
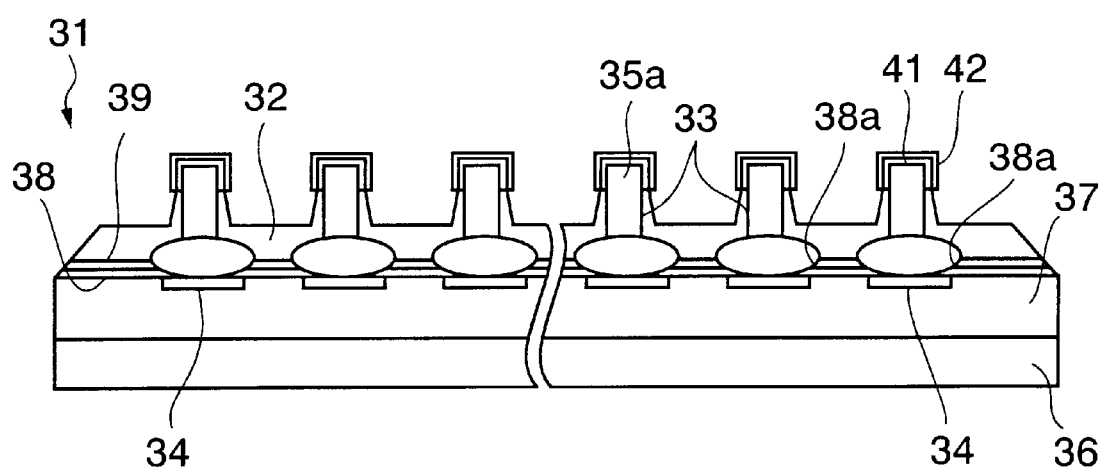
FIG. 17 is a sectional view showing the first semiconductor device according to the second embodiment of the present invention.

(i) FIG. 17 is a first example of the sectional structure taken along the I—I line in FIG. 16.

In FIG. 17, an interlayer insulating film 37 having a multi-layered wiring structure (not shown) is formed on a silicon (semiconductor) substrate 36 on which semiconductor elements are formed. The interlayer insulating film 37 is formed of inorganic insulating material such as silicon oxide, silicon nitride, etc., and then metal pads (metal patterns) 34 are formed thereon. The metal pads 34 are formed of an alloy containing copper, aluminum, or any one of them as a principal component.

An inorganic insulating film 38 such as silicon oxide, silicon nitride, etc., is formed on the metal pads 34 and the interlayer insulating film 37 to have a thickness of 2000 to 2500 nm. Then, an underlying cover film 39 made of the resin such as polyimide, benzocyclobutene, etc., is formed on the inorganic insulating film 38 to have a thickness of 3000 to 4000 nm.

A plurality of opening portions 38a for exposing the metal pads 34 independently are formed in the underlying cover film 39 and the inorganic insulating film 38. If the underlying cover film 39 is formed of a photosensitive resin, openings portions 38a are formed by exposing/developing the underlying cover film 39.

Metal wires 35a each having a length of about 100 μm are formed as a projection-like electrode 35 on the metal pads 34 that are exposed from such openings portions 38a. The metal wires 35a are formed of gold, copper, palladium, or the like, and are connected to the metal pads 34 like a straight wire by using the wire bonding method. Because the metal wires 35a are formed in a straight line, the wire bonding can be performed as a short tact by the existing apparatus.

Lower portions of the metal wires 35a and the underlying cover film 39 are covered with the cover film 32. As the constituent material of the cover film 32, there are benzocyclobutene, bismalimide, silicon resin, epoxy resin, etc., and the cover film 32 is formed by a method such as a spin coating method, a dispensing method, a printing method, a molding method, a laminating method, etc. It is preferable that the constituent material of the cover film 32 has a hygroscopic degree that is less than 0.5% at the room temperature for 24 hours.

Sometimes the cover film 32 formed by the spin coating method, etc., is adhered slightly to the upper portions of the metal wires 35a. In such a case, if the cover film 32 is thinned by the plasma ashing employing O2, CF$_4$ gas, such cover film 32 can be easily removed.

A solder underlying metal layer 41 and a solder layer 42 are formed on surfaces of upper portions of the metal wires 35a that are exposed from the opening portions 33 in the cover film 32. In this case, outer shapes of the solder layer 42 shown in FIG. 17 are formed like a cylinder or a needle. The fine pitch can be achieved by forming the solder layer 42 as the needle shape.

The underlying metal layer 41 has any one of structures shown in FIGS. 18A to 18D.

Figure 18A:
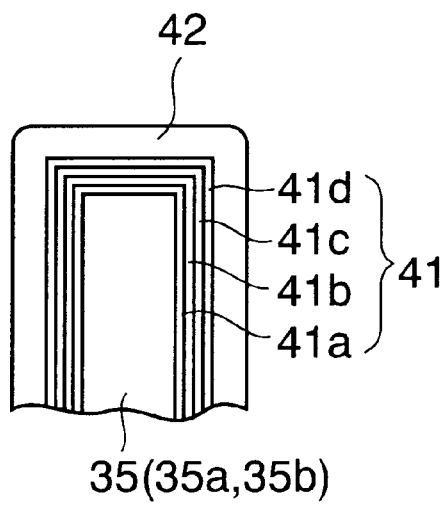
FIGS. 18A to 18D are sectional views showing a structure of an external connection terminal of the first semiconductor device according to the second embodiment of the present invention.
Figure 18B:
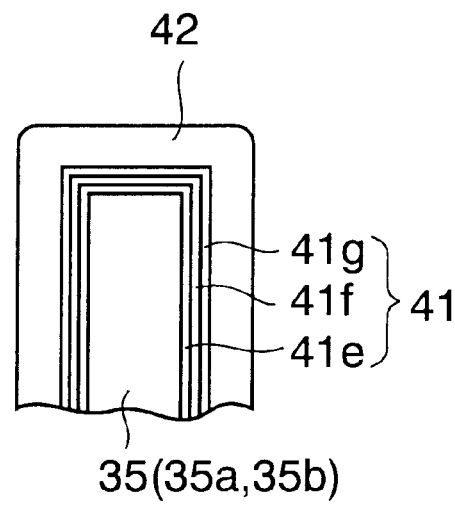

The underlying metal layer 41 in FIG. 18A has an NiP layer 41a, a rich P—Ni layer 41b, an NiSn alloy layer 41c, and rich-Sn containing layer 41d, that are successively formed on the surface of the metal wires 35a as the projection electrodes 35. Then, the solder layer 42 on the rich-Sn containing layer 41d is formed of SnPb. Also, the underlying metal layer 41 in FIG. 18B has an NiCuP layer 41e, a rich P—NiCu layer 41f, and an NiCuSn layer 41g, that are successively formed on the surface of the metal wires 35a as the projection electrodes 35. Then, the solder layer 42 on the NiCuSn layer 41g is formed of SnPb.

Figure 18C:
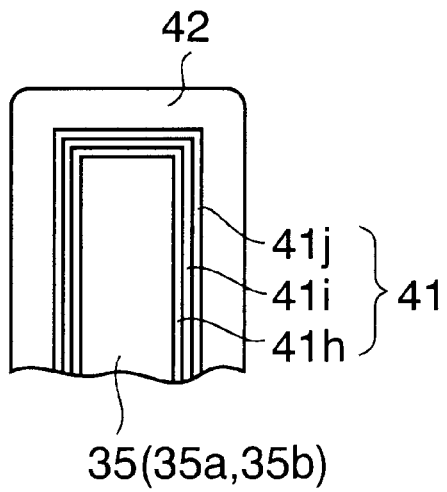
Figure 18D:
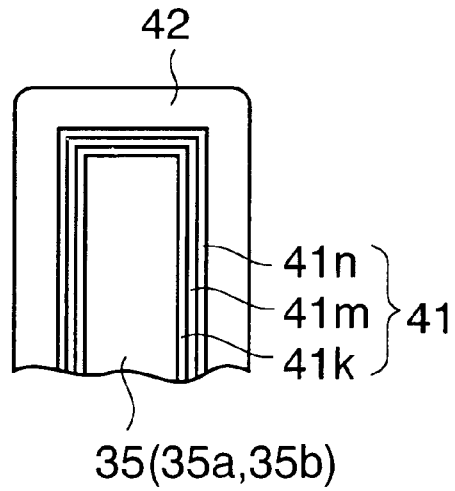

The underlying metal layer 41 in FIG. 18C has an NiP layer 41h, a rich P—Ni layer 41i, and an NiCuSn layer 41j, that are successively formed on the surface of the metal wires 35a as the projection electrodes 35. Then, the solder layer 42 on the NiCuSn layer 41j is formed of SnAgCu. Also, the underlying metal layer 41 in FIG. 18D has an NiCuP layer 41k, a rich P—NiCu layer 41m, and an NiCuSn layer 41n, that are successively formed on the surface of the metal wires 35a as the projection electrodes 35. Then, the solder layer 42 on the NiCuSn layer 41n is formed of SnAgCu.

The method of forming the underlying metal layer 41 and the solder layer 42 is similar to the first embodiment, and the underlying metal layer 41 before the solder layer 42 is jointed is shown in FIGS. 19A to 19D.

Figure 19A:
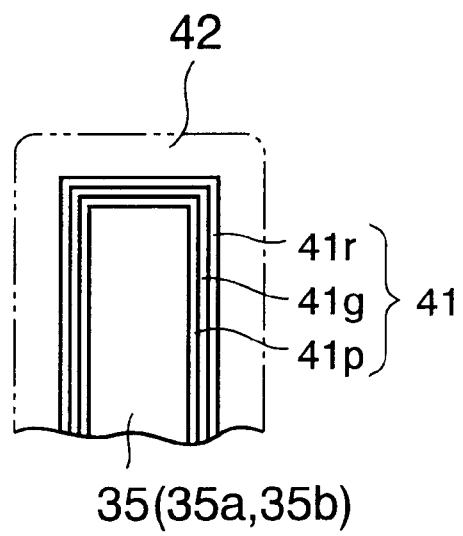
FIGS. 19A to 19D are sectional views showing an initial state of the structure of the external connection terminal of the first semiconductor device according to the second embodiment of the present invention.

FIG. 19A shows an initial state of the underlying metal layer 41. An NiP layer 41p, a Pd layer (thickness of less than 200 nm) 41q, and an Au layer (thickness of less than 100 nm) 41r are formed in sequence on the surface of the metal wires 35a by the electroless plating method. When the SnPb solder layer 42 is formed thereon and then such solder layer 42 is heated at a temperature greater than the melting point for 2 to 10 minutes, a structure shown in FIG. 18A can be obtained.

Figure 19B:
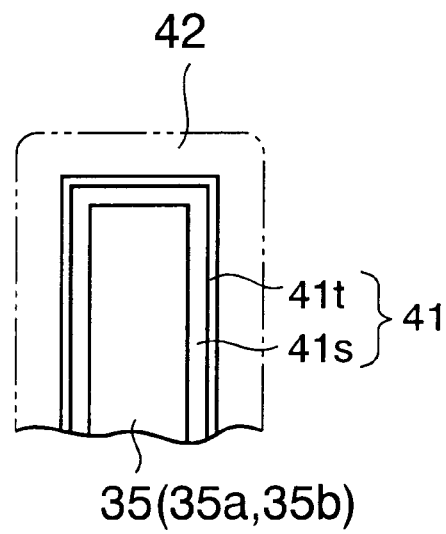

FIG. 19B shows another initial state of the underlying metal layer 41. An NiCuP layer 41s, and an Au or Pd layer 41t are formed in sequence on the surface of the metal wires 35a by the electroless plating method. When the SnPb solder layer 42 is formed thereon and then such solder layer 42 is heated at the temperature of more than the melting point for 2 to 10 minutes, a structure shown in FIG. 18B can be obtained.

Figure 19C:
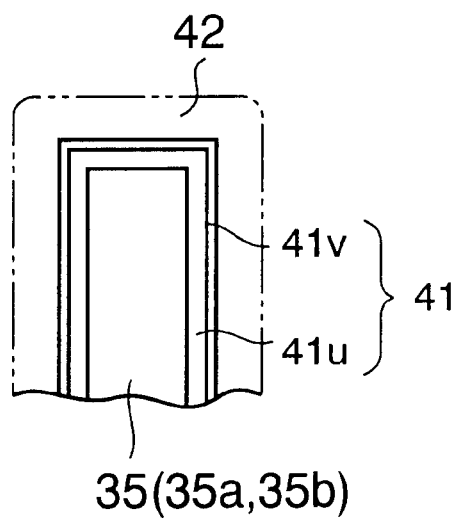

FIG. 19C shows still another initial state of the underlying metal layer 41. An NiP layer 41u, and an Au or Pd layer 41v are formed in sequence on the surface of the metal wires 35a by the electroless plating method. When the SnCuAg solder layer 42 is formed thereon and then such a solder layer 42 is heated at the temperature of more than the melting point for 2 to 10 minutes, a structure shown in FIG. 18C can be obtained.

Figure 19D:
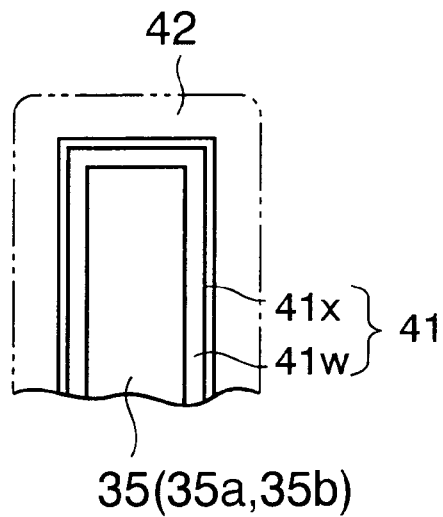

FIG. 19D shows a yet still another initial state of the underlying metal layer 41. An NiCuP layer 41w, and an Au or Pd layer 41x are formed in sequence on the surface of the metal wires 35a by the electroless plating method. When the SnCuAg solder layer 42 is formed thereon and then such solder layer 42 is heated at the temperature of more than the melting point for 2 to 10 minutes, a structure shown in FIG. 18D can be obtained.

Because the above-mentioned metal layers are formed by the electroless plating method, the film thickness can be uniformized and, thus, the fine pitch of the connection terminals 35 can be achieved.

In this case, the film thickness of the Au or Pd layers 41t, 41v, 41x is set to less than 100 nm.

Next, respective steps from the step of forming the underlying cover film 39 in a plurality of semiconductor devices formed on the semiconductor wafer to the step of dividing a semiconductor wafer into the semiconductor devices 31 will be explained hereunder.

First, as shown in FIG. 20A, a semiconductor wafer 50 is prepared on which a plurality of semiconductor devices 31 are formed. In this case, in respective semiconductor devices, the inorganic insulating film 38 for covering the metal pads 34 is positioned as the uppermost surface.

Then, as shown in FIG. 20B, the underlying cover film 39 is formed on the inorganic insulating film 38 by the method such as a spin coating method, a dispensing method, a laminating method, etc., then the opening portions 38a are formed on a part of the metal pads 34 by patterning the underlying cover film 39, and then the metal pads 34 are exposed by etching the inorganic insulating film 38 while using the underlying cover film 39 as a mask. In case the underlying cover film 39 is omitted, the opening portions 38a which expose the metal pads 34 are formed by patterning the inorganic insulating film 38 by virtue of the photolithography method.

Further, as shown in FIG. 20C, the metal wires 35a are connected to the metal pads 34 as the projection-like electrodes 35 via the opening portions 38a, respectively. The projection-like electrodes 35 as the metal wires 35a are connected by the wire bonding method. The constituent material of the projection-like electrodes 35 can be selected from metals such as gold, copper, palladium, and others.

Then, as shown in FIG. 20D, the cover film 32 having a thickness to expose the upper portions of the projection-like electrodes 35 is formed on the underlying cover film 39. After this, the cover film 32 is removed from areas except the semiconductor devices 31 by patterning it.

Then, as shown in FIG. 20E, the underlying metal layer 41 shown in any one of FIGS. 19A to 19D is formed on surfaces of a plurality of projection-like electrodes 35 exposed from the cover film 32, and then the solder layer 42 is formed on the underlying metal layer 41. In this case, before the underlying cover film 39 and the cover film 32 are formed, the NiP layer or the NiCuP layer constituting the underlying metal layer 41 may be formed in advance on the surfaces of the projection-like electrodes 35.

Then, as shown in FIG. 20F, respective semiconductor devices 31 are separated by laser-cutting or dicing the semiconductor wafer 50.

Accordingly, the formation of the chip-like semiconductor devices each having the structure shown in FIG. 18 can be completed.

Figure 21:
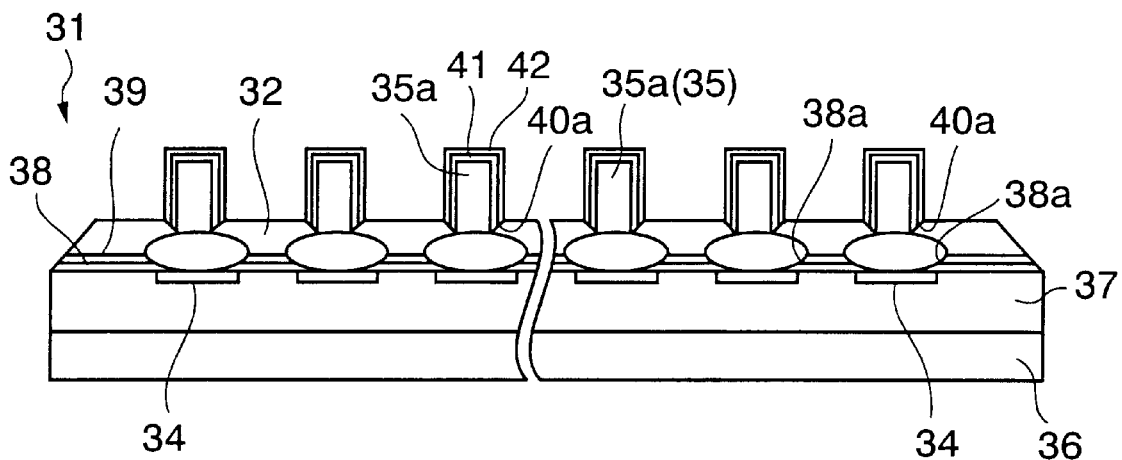
FIG. 21 is a sectional view showing a second semiconductor device according to the second embodiment of the present invention.

When the cover film 32 is patterned in the steps shown in FIG. 20D, the semiconductor device 31 shown in FIG. 21 can be formed by removing the cover film 32 from the surfaces of the metal wires 35a except their root portions.

Figure 22:
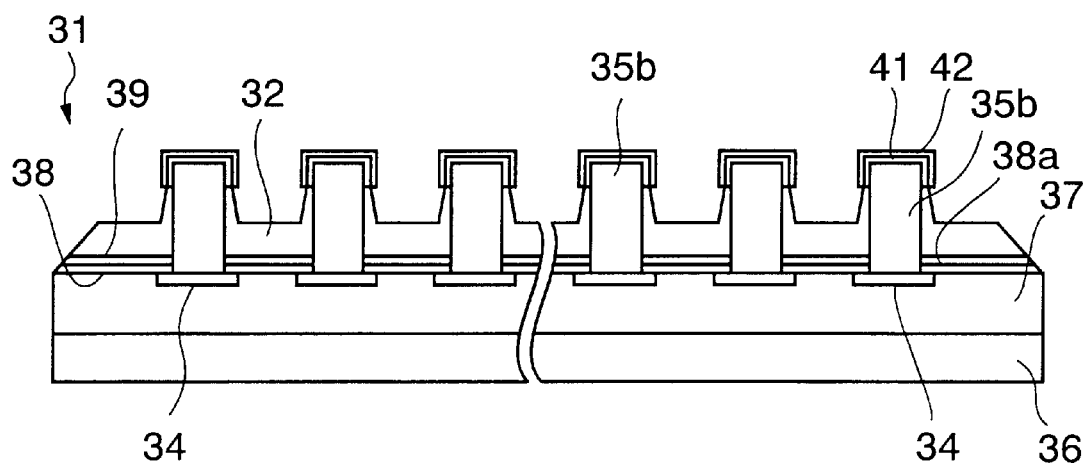
FIG. 22 is a sectional view showing a third semiconductor device according to the second embodiment of the present invention.

(ii) FIG. 22 is a second example of the sectional structure taken along the I—I line in FIG. 16. In FIG. 22, the same references as those in FIG. 17 denote the same elements.

In FIG. 22, a plurality of metal pads 34 are formed on the interlayer insulating film 37 on the silicon substrate 36. Also, the inorganic insulating film 38 is formed on the metal pads 34 and the interlayer insulating film 37, and then the underlying cover film 39 made of resin such as polyimide, benzocyclobutene, epoxy, etc. is formed on the inorganic insulating film 38. It is desired that such resin has the photosensitivity.

A plurality of opening portions 38a are formed in the underlying cover film 39 and the inorganic insulating film 38 to expose the metal pads 34, respectively. If the underlying cover film 39 is formed of photosensitive resin, the opening portions 38a can be formed by exposing/developing the underlying cover film 39.

Metal columns 35b having a height of about 100 μm and made of gold, copper, or palladium are formed as the projection-like electrodes 35 on the metal pads 34, that are exposed from the opening portions 38a, by the electrolytic plating or the electroless plating. Outer shapes of the rod-like metal columns 35b are a circular cylindrical shape or a polygonal shape. Accordingly, the length of the terminals can be enlarged so as to not expand the spaces between the projection-like electrodes 35 and, thus, a fine pitch between them can be achieved.

Lower portions of the metal columns 35b and the underlying cover film 39 are covered with the cover film 32 made of the resin, and upper portions of the metal columns 35b are projected from the opening portions 38a in the cover film 32. The cover film 32 is formed by a method such as a spin coating method, a dispensing method, a printing method, a molding method, a laminating method, etc.

The underlying metal layer 41 and the solder layer 42 having the structures shown in FIGS. 18A to 18D are formed in sequence on the upper surface of the metal columns 35b projected from the cover film 32, i.e., the projection-like electrodes 35.

The method of forming the semiconductor device 31 having the structure shown in FIG. 22 can be applied similarly except that the metal columns 35b are formed in place of the metal wires 35a in manufacturing steps shown in FIG. 20A to FIG. 20F. The metal columns 35b are formed on the metal pads 34 by an electroless plating method or an electrolytic plating method.

Meanwhile, in the first example and the second example of the semiconductor device 31 shown in FIG. 17 and FIG. 22, all the layer structures of the underlying metal layer 41 formed on the surface of the metal wires 35a or the metal columns 35b serving as the projection-like electrodes 35 are formed at the position upper than the cover film 32. But such a structure may be employed such that a part of the NiP layers 41p, 41u or the NiCuP layers 41s, 41w of the layers constituting the underlying metal layer 41 shown in FIGS. 19A to 19C may be buried in the cover film 32. According to such a structure, the adhesiveness between the projection-like electrodes 35 and the cover film 32 can be improved.

Figure 23A:
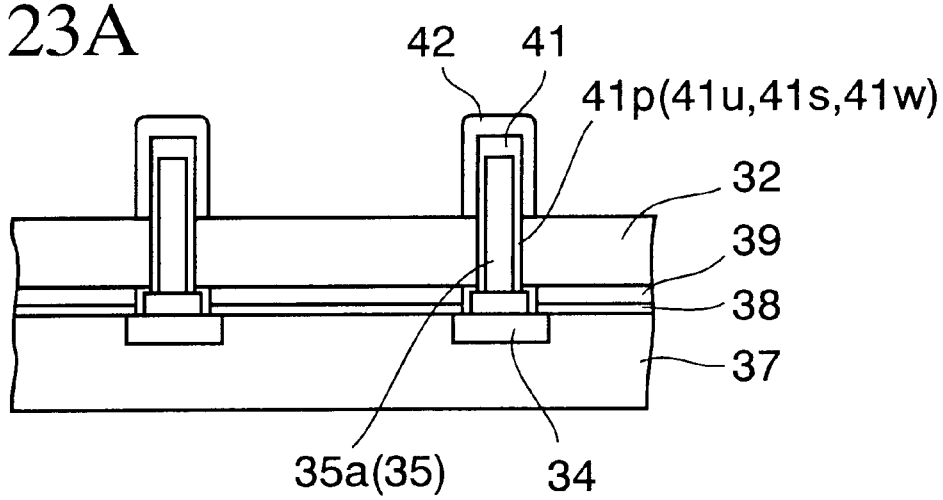
FIGS. 23A and 23B are sectional views showing another structure of an external connection terminal of the third semiconductor device according to the second embodiment of the present invention.
Figure 23B:
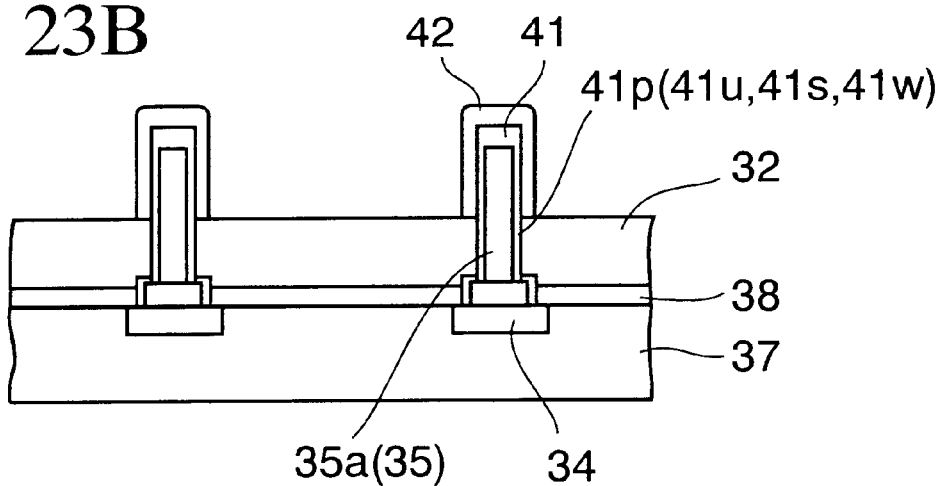

For example, as shown in FIG. 23A, before the cover film 32 is formed on the underlying cover film 39, the NiP layers 41p, 41u or the NiCuP layers 41s, 41w are formed on the surfaces of the metal wires 35a by the electroless plating method, and then the cover film 32 having a thickness to bury the lower portions of the metal wires 35a is formed on the underlying cover film 39. If the underlying cover film 39 in FIG. 23A is omitted, the structure shown in FIG. 23B may be employed.

In this case, all layers of the underlying metal film 41 shown in FIGS. 19A to 19D may be formed on the surfaces of the portions, that are buried in the cover film 32, of the projection-like electrodes 35.

Figure 24A:
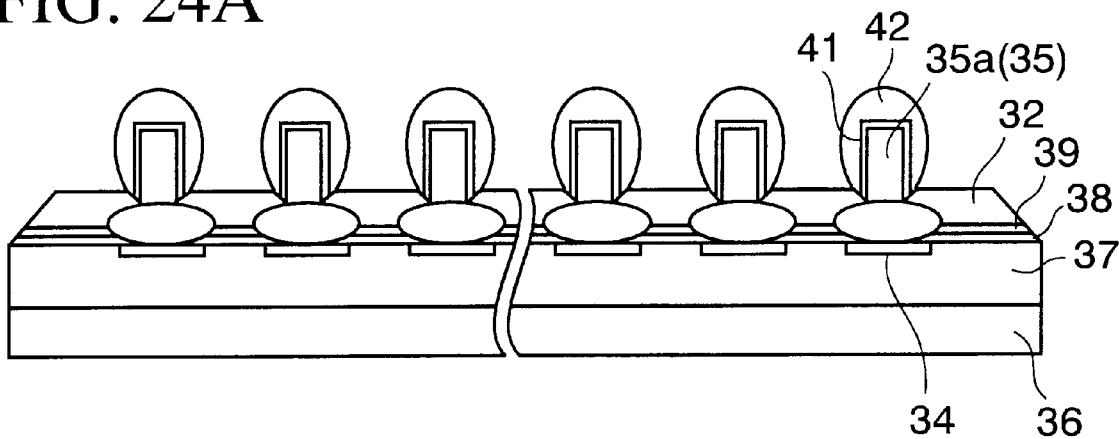
FIGS. 24A and 24B are sectional views showing fourth and fifth semiconductor devices according to the second embodiment of the present invention respectively.
Figure 24B:
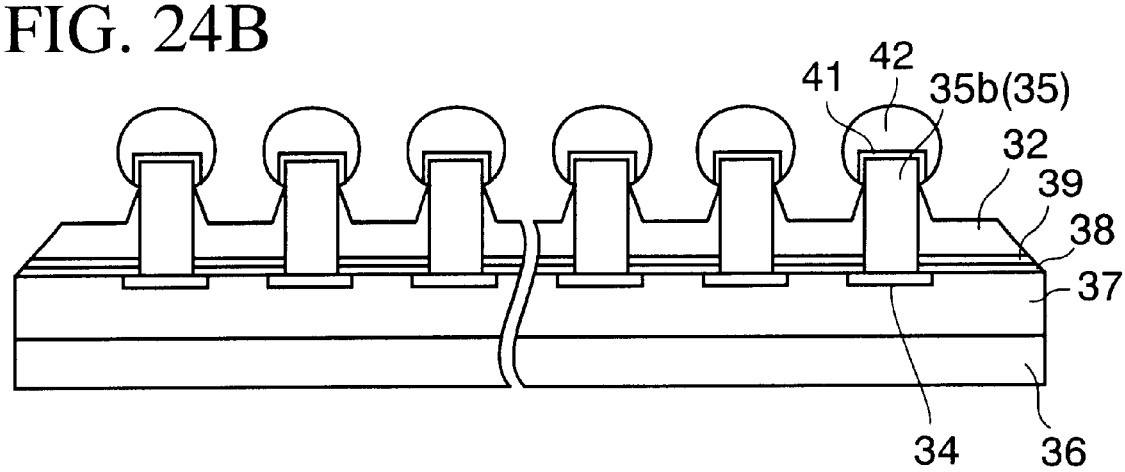

By the way, the outer shapes of the solder layer 42 may be formed as the column shape or the needle shape based on the outer shapes the projection-like electrodes 35 (35a, 35b), as shown in FIG. 17 and FIG. 21, or may be formed as the substantially spherical shape, as shown in FIGS. 24A and 24B. If the solder layer 42 is formed as the spherical shape, the self-alignment effect can be attained and, thus, a high-speed packaging in which the extreme precision is not required can be accomplished.

As the method of coating the substantially spherical solder layer 42, there are a plating method, a ball mounting method, a printing method, etc. The solder shape and the forming method can be applied similarly to other embodiments described in the following.

Figure 25A:
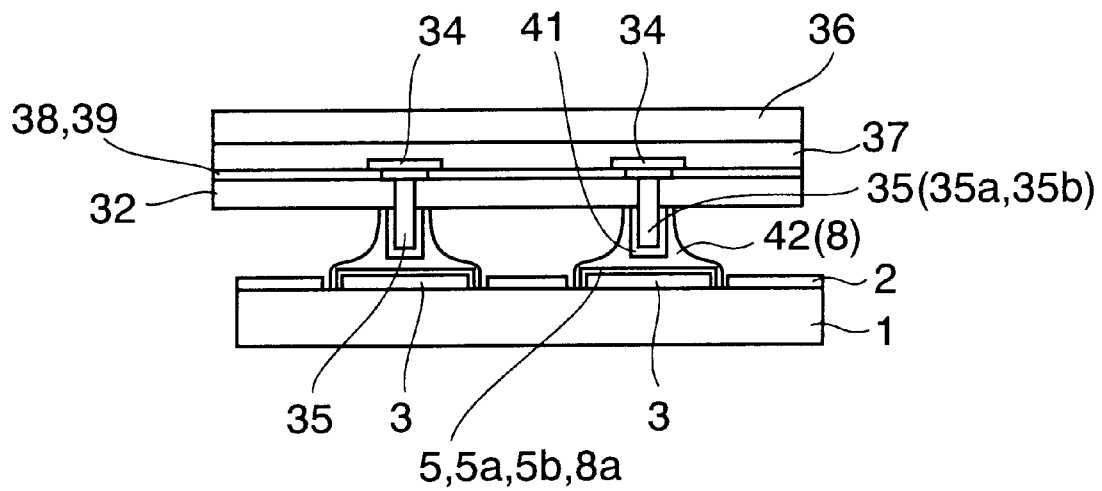
FIGS. 25A and 25B are sectional views showing a connection state between an external connection terminal of the semiconductor devices according to the second embodiment of the present invention and a wiring on a ceramic circuit substrate.
Figure 25B:
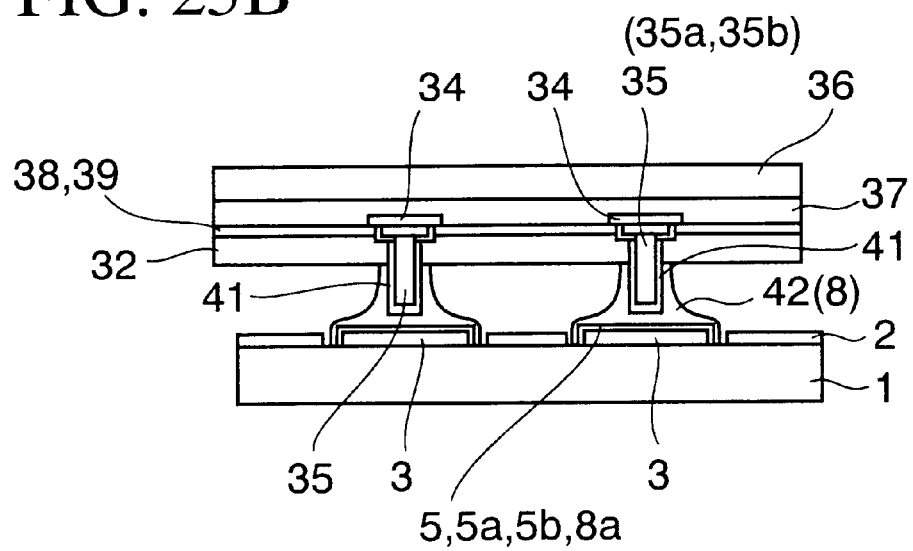

The state that the projection-like electrodes 35 (35a, 35b) of the semiconductor device 31, as mentioned above, are connected to the wirings on the ceramic substrate is shown in FIGS. 25A and 25B. The ceramic substrate shown in FIGS. 25A and 25B has a structure shown in FIG. 6A according to the first embodiment, and the NiP layer 5, etc., are formed on the surface of the wiring. In this case, because the projection-like electrodes 35 are connected via the solder layer 42 and the resin for reinforcing the connected portions is not filled between the semiconductor device 31 and the ceramic substrate 1, high-speed packaging can be carried out by the existing equipment. This connection is similar in embodiments described in the following.

In the case that the solder layer 8 formed on the wiring 3 on the ceramic substrate 1 is employed, a structure obtained after the solder jointing is almost similar if the solder layer 42 on the projection-like electrodes 35 is omitted.

Third Embodiment

In FIG. 17, the projection-like electrodes 35 are connected directly to the surfaces of the metal pads 34 via the opening portions 38a in the underlying cover film 39 and the inorganic insulating film 38 on the semiconductor device 31. However, if an interval between the opening portions 38a is narrowed, the connection of the projection-like electrodes 35 to the metal pads 34 becomes difficult. Therefore, it is preferable that the connection positions of the projection-like electrodes 35 should be changed to the position near the center of the semiconductor device 31.

Figure 26:
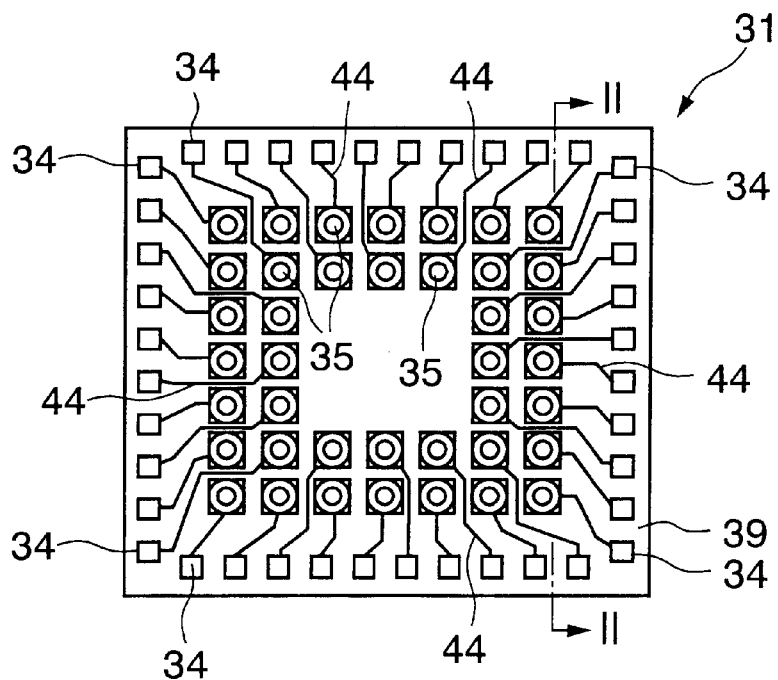
FIG. 26 is a plan view showing a semiconductor device according to a third embodiment of the present invention.
Figure 28:
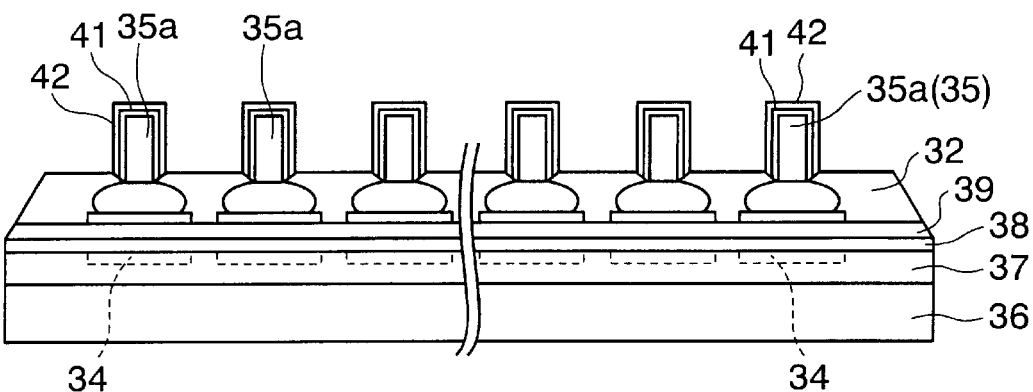
FIG. 28 is a sectional view showing a second semiconductor device according to the third embodiment of the present invention.

In order to change the connection positions of the projection-like electrodes 35, as shown in FIG. 26, it is preferable that leading wirings (also referred to as "relocation wirings" herein) 44 should be formed to extend from the metal pads 34, that exist in the neighborhood of the periphery of the semiconductor device 31, to the inside areas. In FIG. 28, the cover film 32 is omitted.

Here, the sides that are remote from the metal pads 34, out of two edge portions of the leading wirings 44 are assumed as relocation areas.

Figure 27:
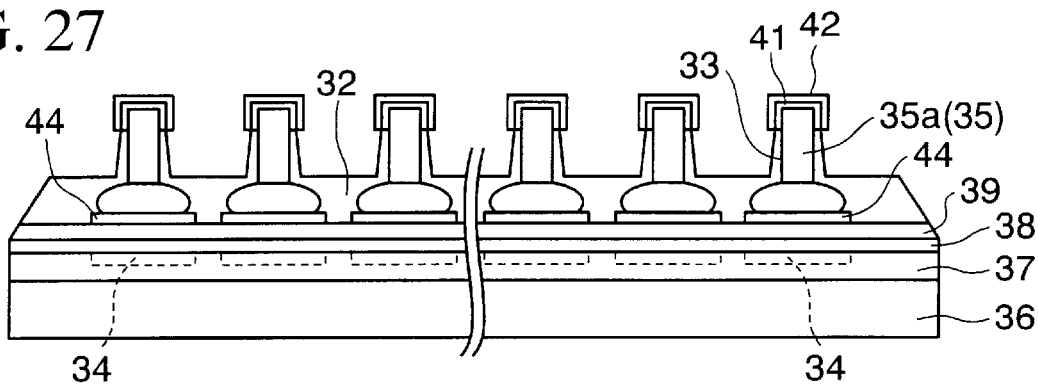
FIG. 27 is a sectional view showing a first semiconductor device according to the third embodiment of the present invention.
Figure 29:
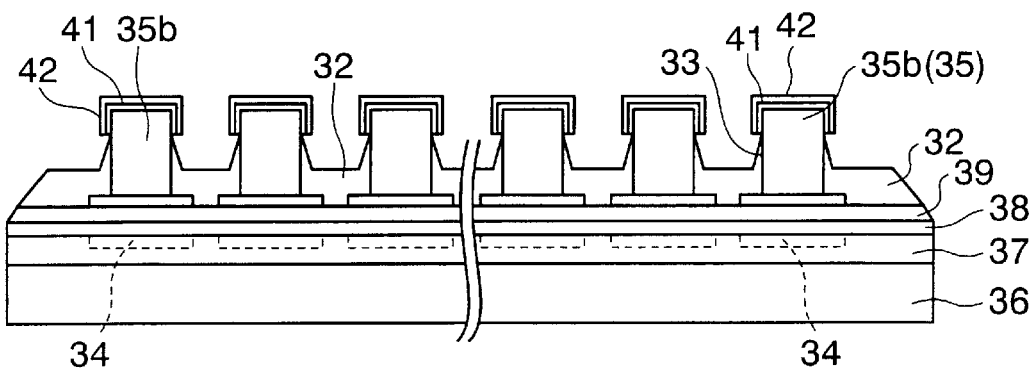
FIG. 29 is a sectional view showing a third semiconductor device according to the third embodiment of the present invention.

In FIG. 26, sectional shapes in the relocation areas of the leading wirings 44 taken along a II—II line are shown in FIG. 27, FIG. 28, and FIG. 29. FIG. 27 shows a structure in which electrical connection positions between the metal wires 35a as the projection-like electrodes 35 shown in FIG. 17 and the metal pads 34 are changed. FIG. 28 shows a structure in which electrical connection positions between the metal wires 35a shown in FIG. 21 and the metal pads 34 are changed. FIG. 29 shows a structure in which electrical connection positions between the metal columns 35b as the projection-like electrodes 35 shown in FIG. 22 and the metal pads 34 are changed.

Figure 30:
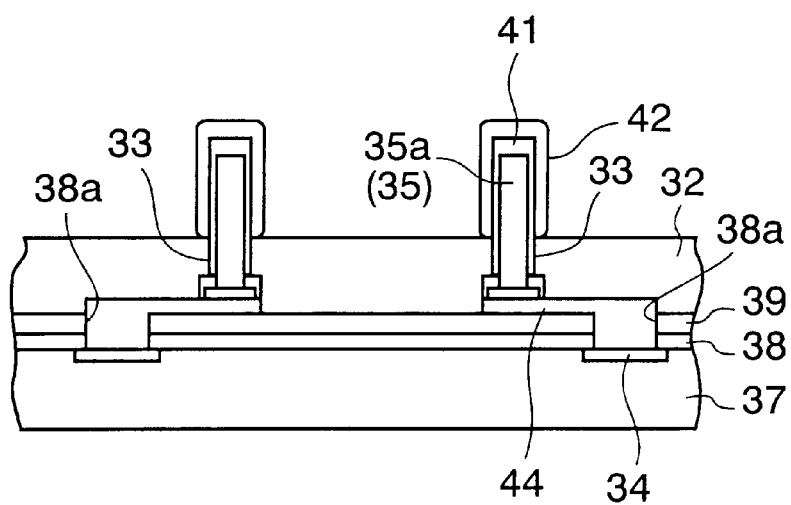
FIG. 30 is a sectional view showing a connection state of an external terminal of the semiconductor device according to the third embodiment of the present invention.

The underlying metal layer 41 and the solder layer 42 in the second embodiment are formed on the surfaces of the projection-like electrodes 35 (35a, 35b) shown in FIG. 26 to FIG. 29. Also, in the structure for connecting the projection-like electrodes 35 to the relocation areas of the leading wirings 44, all or a part of the layers of the underlying metal layer 41 may be formed on portions, which are buried in the cover film 32, of the surfaces of the projection-like electrodes 35. An example of such a structure is shown in FIG. 30.

In FIG. 26 to FIG. 30, the same references as those in FIG. 16 to FIG. 23B denote the same elements as those in FIG. 16 to FIG. 23B.

Figure 31A:
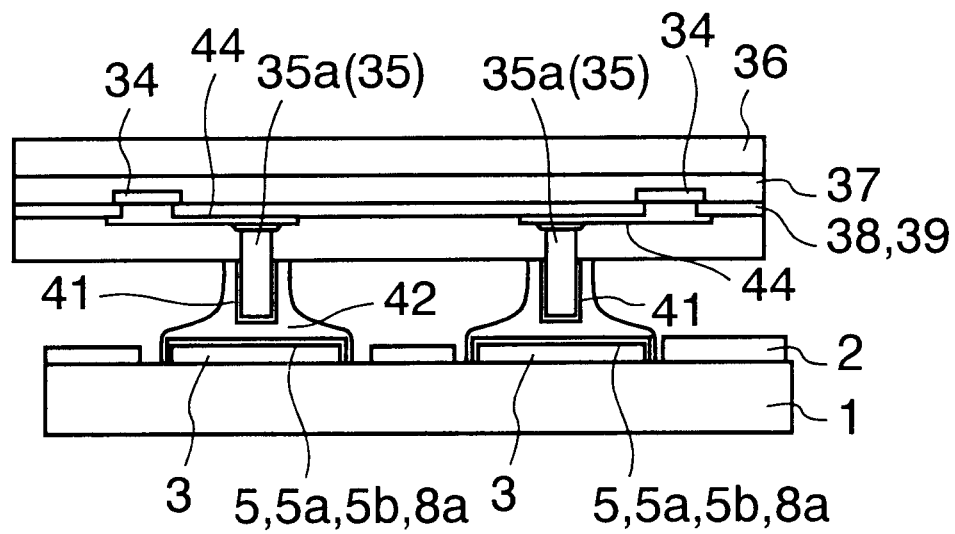
FIGS. 31A and 31B are sectional views showing a connection state between an external connection terminal of the semiconductor devices according to the third embodiment of the present invention and the wiring on the ceramic circuit substrate.
Figure 31B:
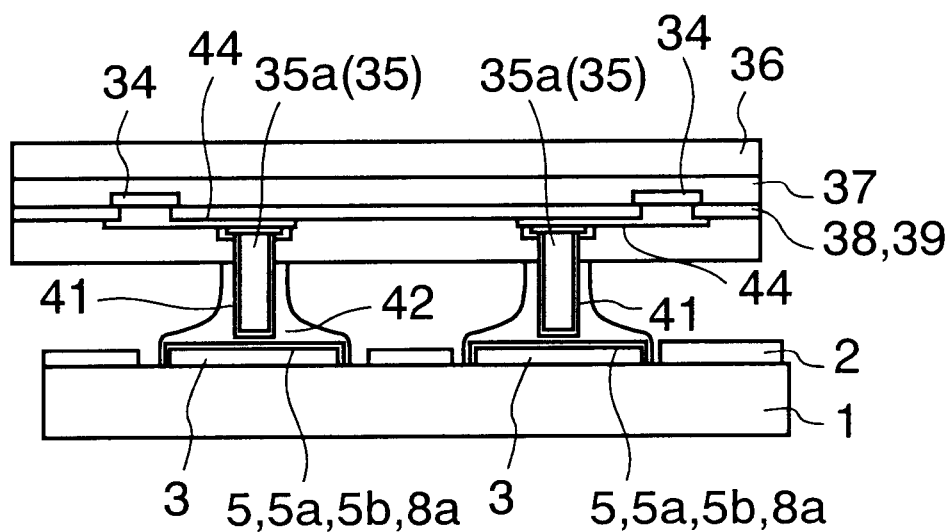

The connection state between the projection-like electrodes 35 whose connection positions are changed and the wirings on the ceramic substrate is shown in FIG. 31 A. The ceramic substrate 1 shown in FIG. 31A has the structure shown in FIG. 6E in the first embodiment, and the NiP layer 5, etc., are formed on the surface of the wiring 3 on the ceramic substrate 1. In this case, the projection-like electrodes 35 are connected to the wirings 3 via the solder layers 42. FIG. 31B shows the connection between the projection-like electrodes 35, in which the underlying metal film 41 is formed in the area being covered with the cover film 32, and the wirings 3.

Next, steps required from the formation of the relocation wirings 44 on the semiconductor wafer 50 to the division of the semiconductor wafer 50 will be explained hereunder.

Figure 32A:
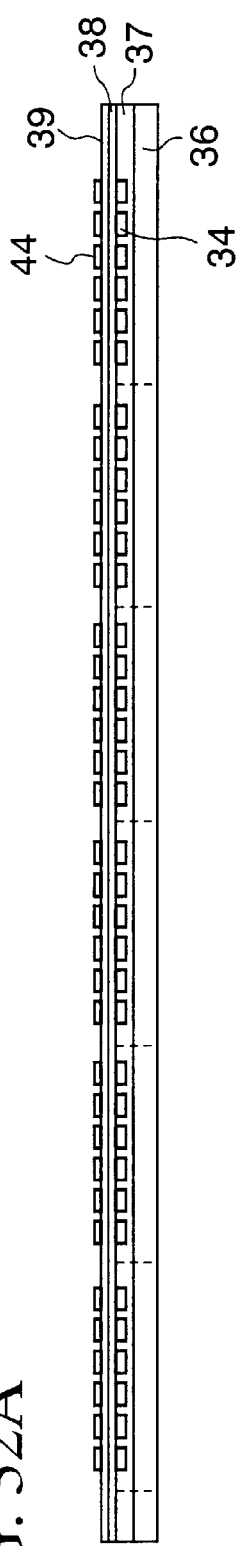
FIGS. 32A to 32D are sectional views showing steps of forming the semiconductor device according to the third embodiment of the present invention.

A structure shown in FIG. 32A is formed via steps described in the following.

First, the semiconductor wafer 50 on which a plurality of semiconductor devices are formed is prepared. The semiconductor devices are covered with the inorganic insulating film 38 and the underlying cover film 39. Then, the opening portions 38a shown in FIG. 29 are formed on the metal pads 34 by patterning the underlying cover film 39 and the inorganic insulating film 38 to expose the metal pads 34. Then, a metal film such as aluminum, gold, copper, or the like is formed in the opening portions 38a and on the inorganic insulating film 38, and then a plurality of relocation wirings (metal patterns) 44 shown in FIG. 26 are by patterning the metal film.

Figure 32B:
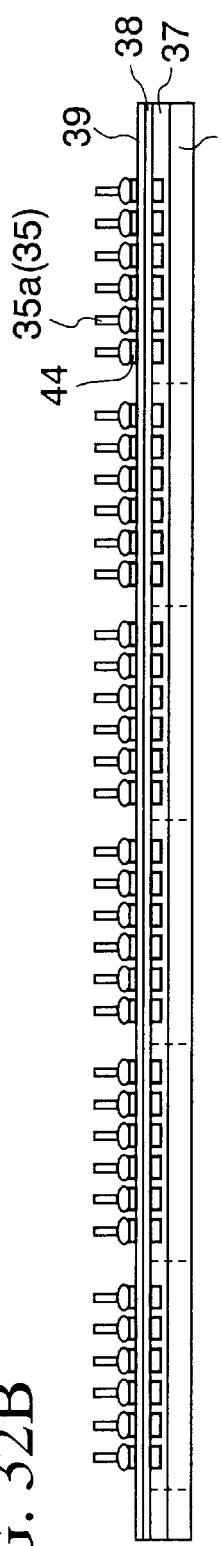

Then, as shown in FIG. 32B, the projection-like electrodes 35 are connected to the relocation areas of the relocation wirings 44, respectively. These projection-like electrodes 35 are formed by the same method as the second embodiment.

Figure 32C:
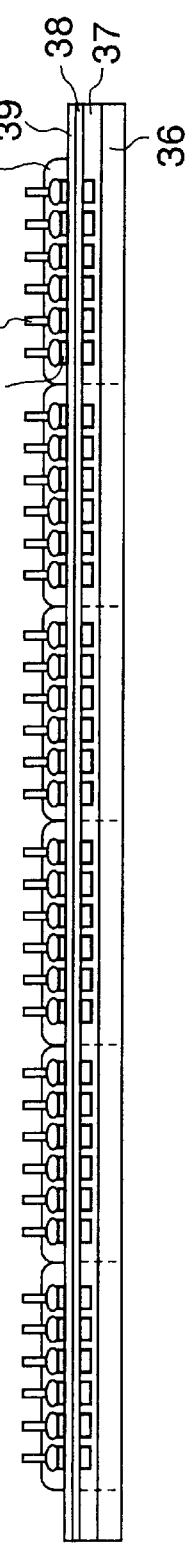

Then, as shown in FIG. 32C, the cover film 32 is formed on the projection-like electrodes 35 and the underlying cover film 39 to expose the upper portions of the projection-like electrodes 35. Then, if the cover film 32 is formed of the photosensitive material, such cover film 32 is patterned to be left on the semiconductor devices.

Figure 32D:
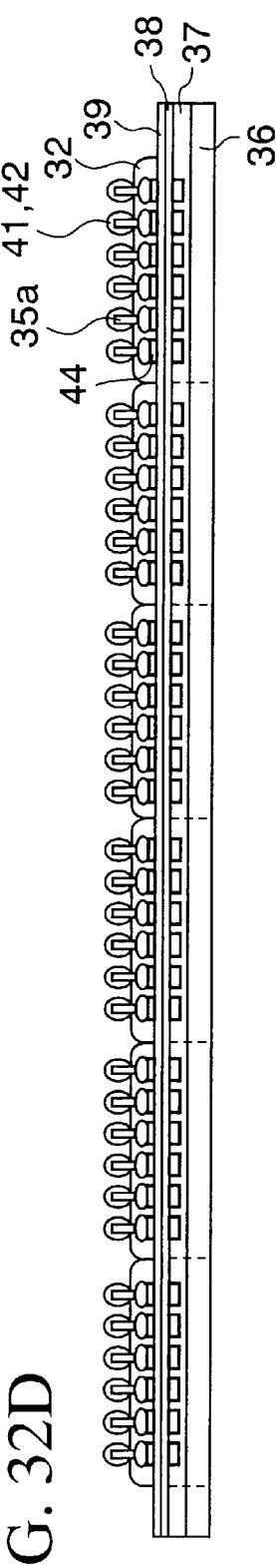

Then, as shown in FIG. 32D, the underlying metal layer 41 and the solder layer, as shown in FIGS. 18A to 18D, are formed on the surfaces of the plurality of projection-like electrodes 35 exposed from the cover film 32. In this case, prior to the formation of the underlying cover film 39 and the cover film 32, all or a part of layers constituting the underlying cover film 41 may be formed previously on the surfaces of the projection-like electrodes 35, as shown in FIG. 30.

Then, the semiconductor devices 31 are separated by laser-cutting or dicing the semiconductor wafer 50.

Accordingly, the formation of the chip-like semiconductor device 31 having the structures shown in FIG. 27, FIG. 28, and FIG. 29 can be completed.

Fourth Embodiment

In the present embodiment, a structure that has projection-like electrodes as external connection terminals and reduces the exposed area of the semiconductor substrate and a method of forming the same will be explained hereunder.

Figure 33:
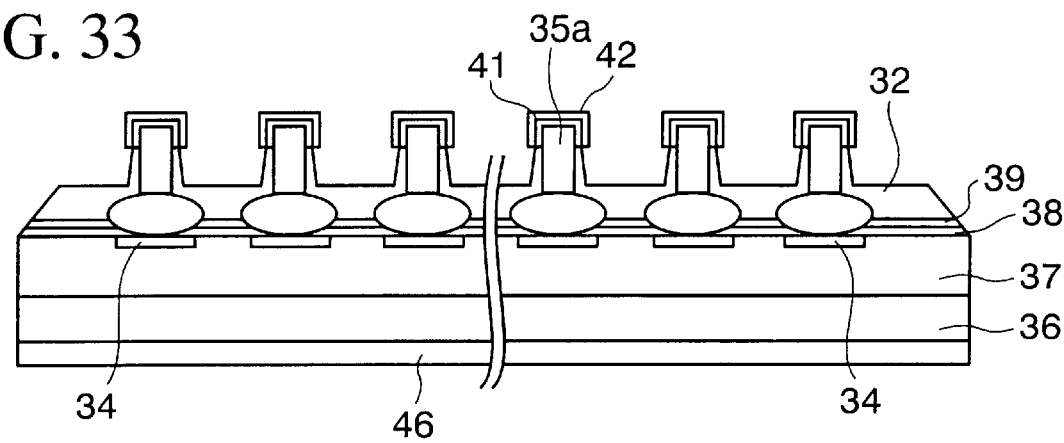
FIG. 33 is a sectional view showing a first semiconductor device according to a fourth embodiment of the present invention.
Figure 34:
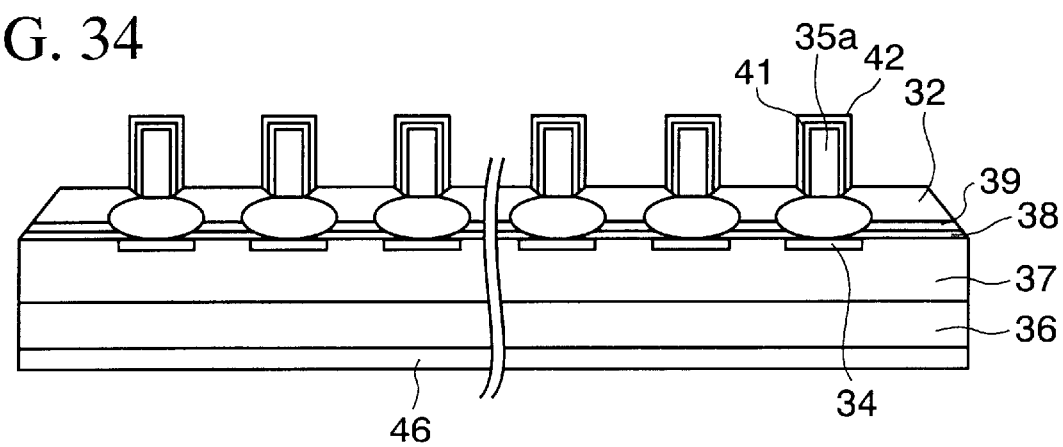
FIG. 34 is a sectional view showing a second semiconductor device according to the fourth embodiment of the present invention.
Figure 35:
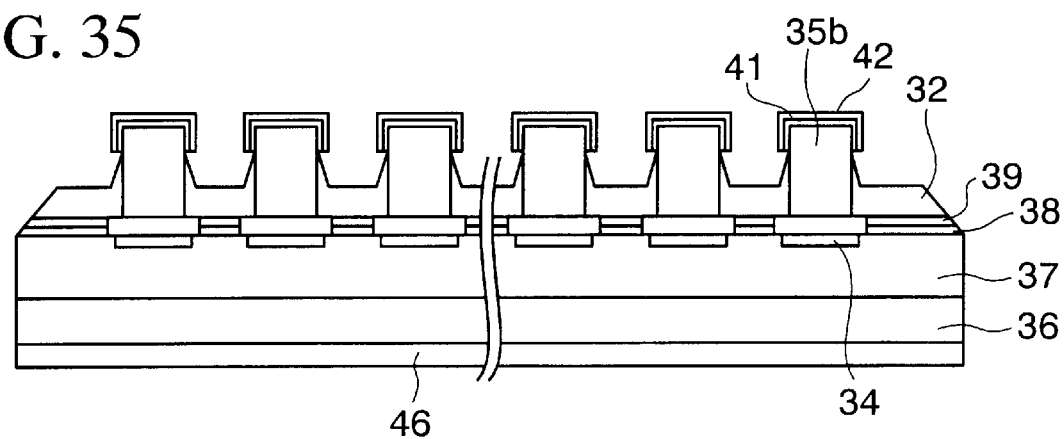
FIG. 35 is a sectional view showing a third semiconductor device according to the fourth embodiment of the present invention.

(i) A structure in which a coating film is formed on an upper surface and a back surface of the semiconductor substrate FIG. 33, FIG. 34, and FIG. 35 are sectional views showing structures in which an under coating film 46 is formed on a lower surface of the semiconductor substrates 36 shown in FIG. 17, FIG. 21, and FIG. 22 respectively.

The under coating film 46 is formed of a resin such as polyimide, benzocyclobutene, bismalimide, silicon resin, epoxy resin, etc., for example, or a metal such as copper (Cu), titanium (Ti), aluminum (Al), nickel (Ni), etc.

Then, steps of forming the semiconductor device 31 shown in FIG. 33 will be explained hereunder.

Figure 36A:
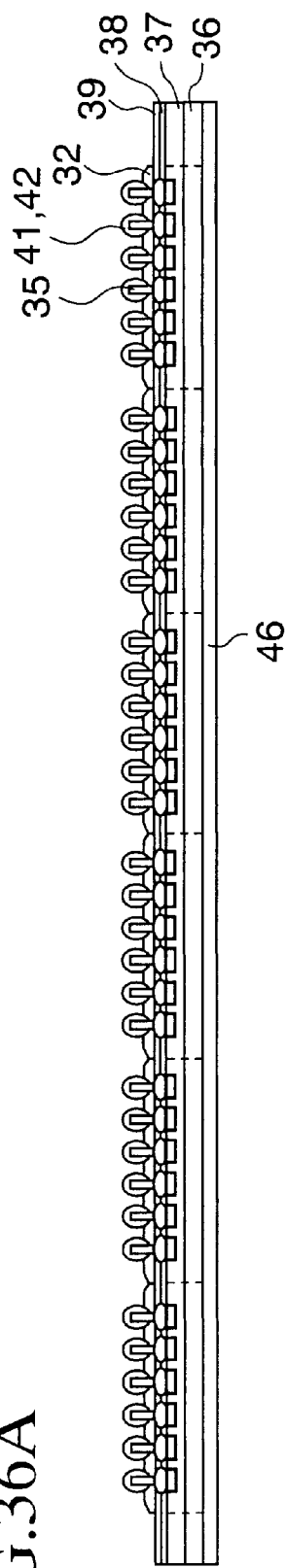
FIGS. 36A and 36B are sectional views showing steps of forming the first, second or third semiconductor device according to the fourth embodiment of the present invention.

First, the under coating film 46 made of the resin or the metal is formed on the lower surface of the semiconductor wafer 50, as shown in FIG. 36A, from the state shown in the second embodiment. Such resin is formed on the lower surface of the semiconductor wafer 50 by a method such as a spin coating method, a dispensing method, a printing method, a molding method, a laminating method, etc. Also, such metal is formed on the lower surface of the semiconductor wafer 50 by a method such as a sputter method, a plating method, a laminating method, etc.

Figure 36B:
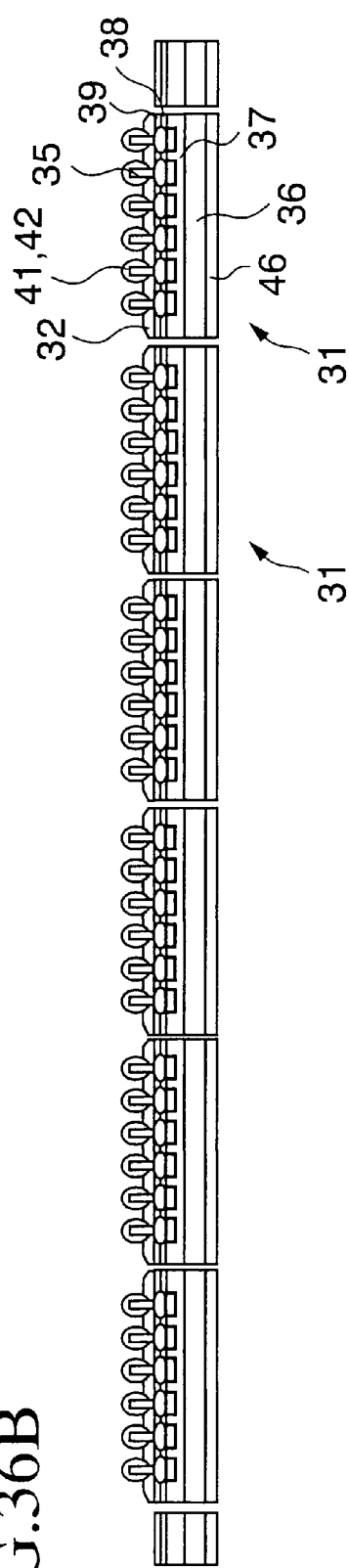

Then, as shown in FIG. 36B, the semiconductor devices 31 are separated mutually by dicing the semiconductor wafer 50.

Accordingly, the formation of the chip-like semiconductor device 31 having the structure shown in FIG. 17 can be completed.

Figure 37A:
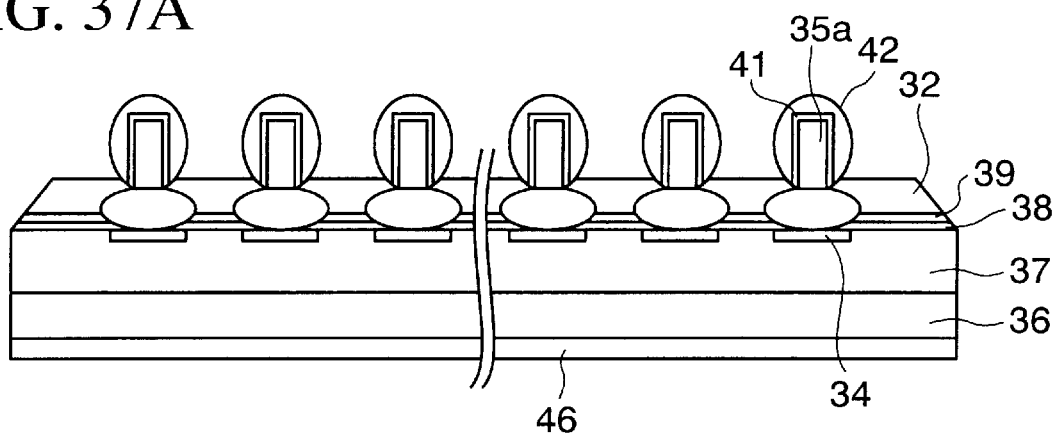
FIGS. 37A and 37B are sectional views showing fourth and fifth semiconductor devices according to the fourth embodiment of the present invention respectively.
Figure 37B:
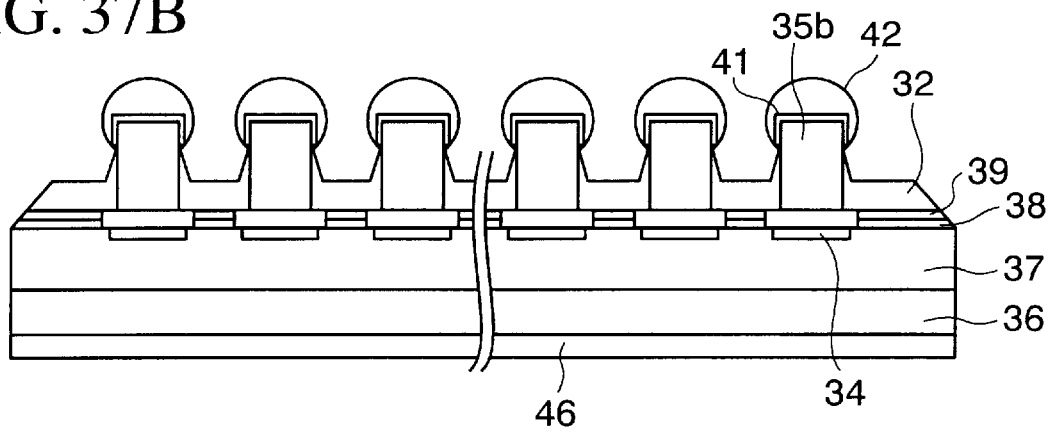

In this case, the solder layer formed on the surfaces of the projection-like electrodes 35 may be formed as the substantially spherical shape. For example, the solder layers 42 whose outer shape is a cylindrical shape or a needle shape are formed on the surfaces of the projection-like electrodes 35 in FIG. 34 and FIG. 35, but they may be formed as the substantially spherical shape, as shown in FIGS. 37A and 37B. The solder layers 42 whose outer shape is substantially spherical shape may be formed by a plating method, a ball mounting method, a printing method, etc.

Figure 38:
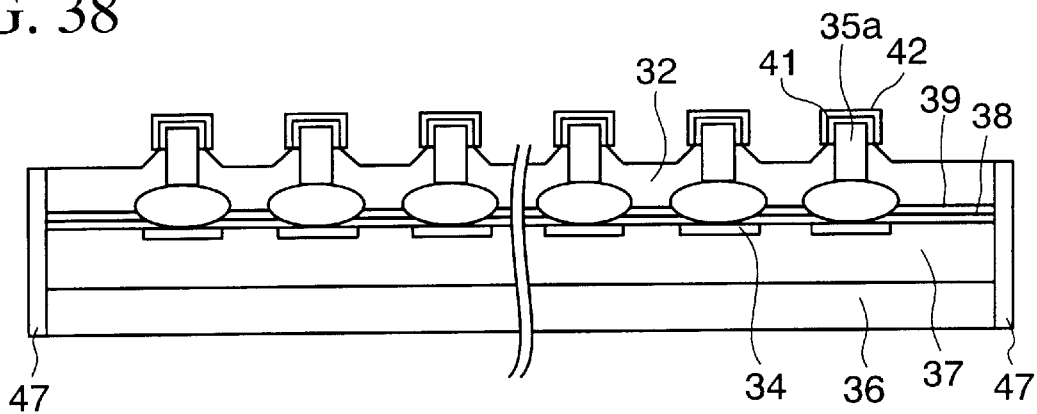
FIG. 38 is a sectional view showing a sixth semiconductor device according to the fourth embodiment of the present invention.
Figure 39:
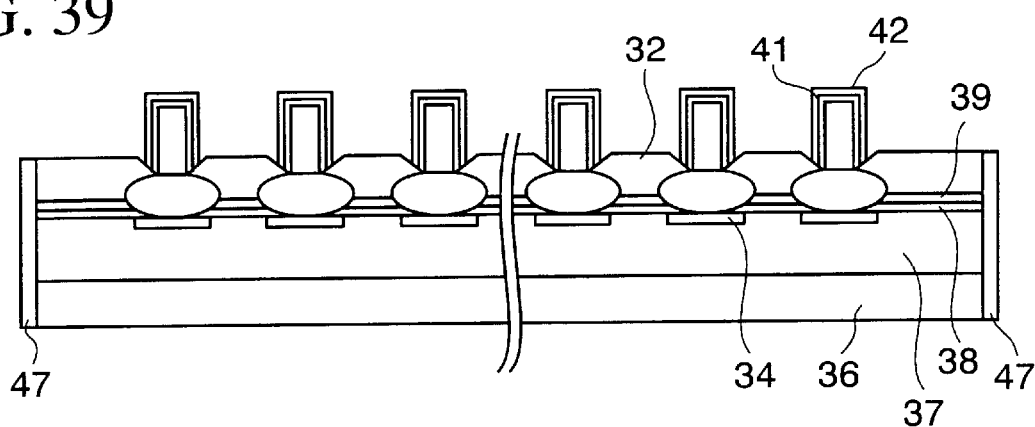
FIG. 39 is a sectional view showing a seventh semiconductor device according to the fourth embodiment of the present invention.
Figure 40:
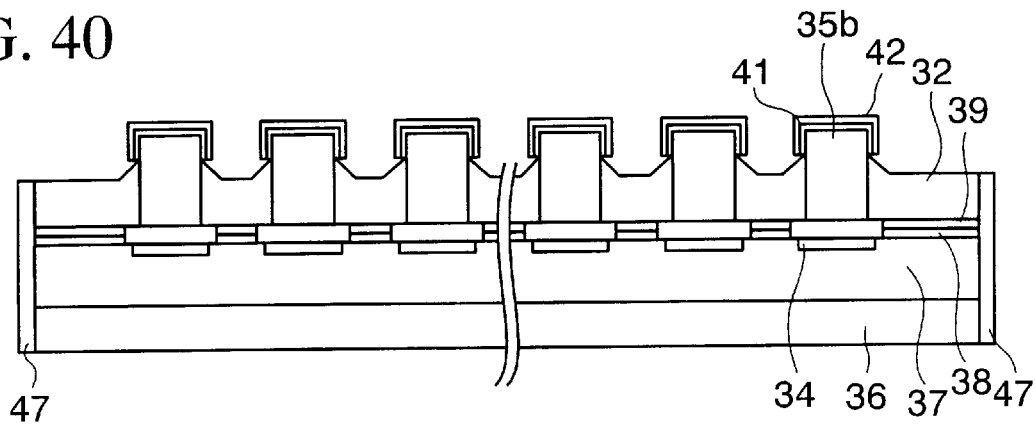
FIG. 40 is a sectional view showing an eighth semiconductor device according to the fourth embodiment of the present invention.

(ii) A structure in which a coating film is formed on an upper surface and side surfaces of the substrate FIG. 38, FIG. 39, and FIG. 40 are sectional views showing structures in which a side coating film 47 is formed on side surfaces of the semiconductor substrates 36 shown in FIG. 17, FIG. 21, and FIG. 22, respectively.

The side coating film 47 is formed of the resin such as polyimide, benzocyclobutene, bismalimide, silicon resin, epoxy resin, etc., for example, or metal such as copper (Cu), titanium (Ti), aluminum (Al), nickel (Ni), etc.

Then, steps of forming the semiconductor device 31 shown in FIG. 38 will be explained hereunder.

Like FIG. 20C, FIG. 41A showing a state such that the metal wires 35a serving as the projection-like electrodes 35 are connected to the metal pads 34 of the plurality of semiconductor devices 31 formed on the semiconductor wafer 50.

Then, as shown in FIG. 41B, grooves 51 having a depth of 200 to 400 μm are formed along the scribe line provided around the semiconductor devices 31 of the semiconductor wafer 50. The grooves 51 may be formed by not only a method using a blade but also by etching.

Then, as shown in FIG. 41C, a resin film 47a for covering the grooves 51, the metal wires 35a, and the semiconductor devices 31 is formed on the semiconductor wafer 50. Such resin film 47a is formed by a method such as a spin coating method, a dispensing method, a printing method, a molding method, a laminating method, etc.

Figure 41D:
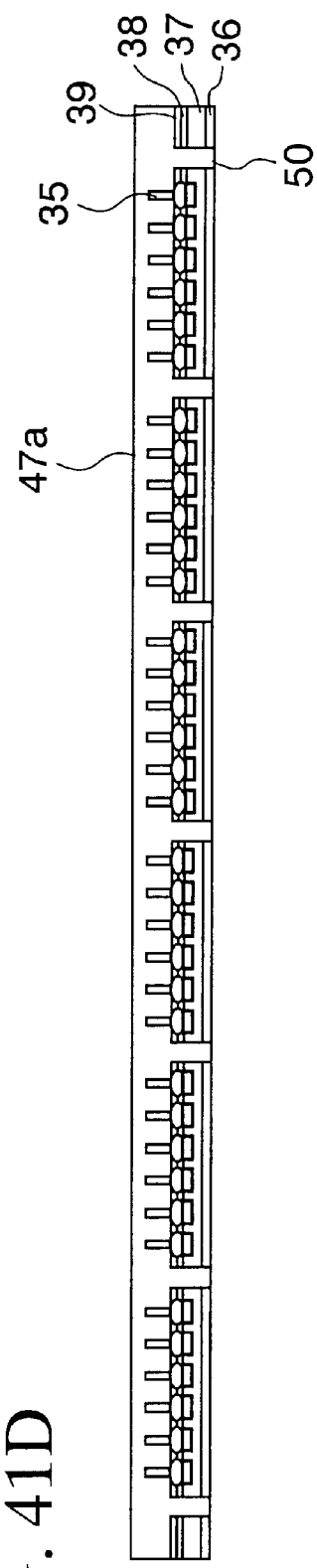
FIGS. 41A and 41F are sectional views showing steps of forming the sixth, seventh or eighth semiconductor device according to the fourth embodiment of the present invention.

Then, the lower surface of the semiconductor wafer 50 is polished by a CMP (Chemical Mechanical Polishing) method or by a back grinding method to reach the bottom portions of the grooves 51, as shown in FIG. 41D. A plurality of semiconductor devices 31 formed on the semiconductor wafer 50 are substantially divided at this stage, but they are connected mutually via the resin film 47a. In this case, the metal wires 35a are protected by the resin film 47a.

Figure 41E:
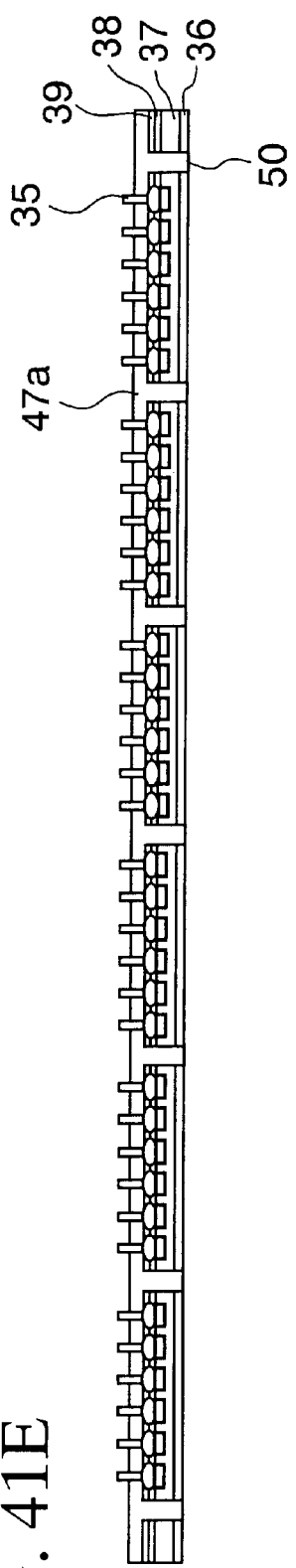

Then, as shown in FIG. 41E, the resin film 47a is thinned by etching until the upper portions of the metal wires 35a are exposed.

Figure 41F:
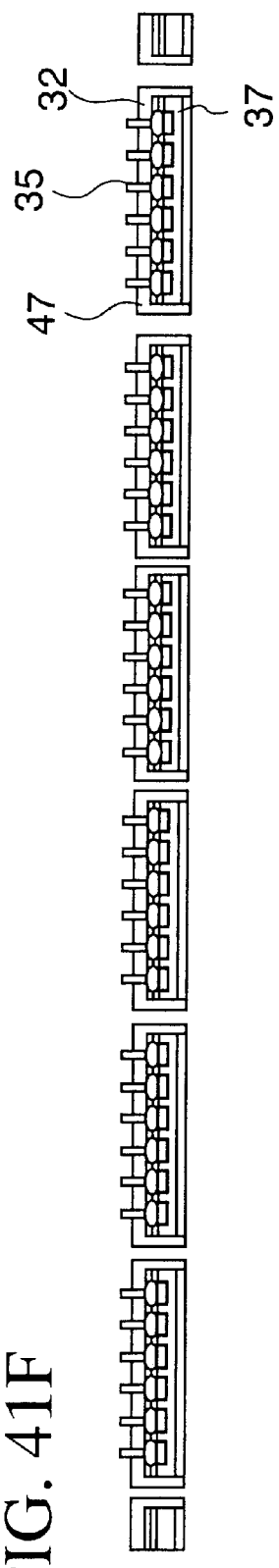

Then, as shown in FIG. 41F, when the semiconductor devices 31 are separated by cutting the resin film 47a in the grooves 51, the resin film 47a is left on the side surfaces of the semiconductor substrate 36 constituting the semiconductor device 31 as the side coating layer 47 and also the resin film 47a left on the semiconductor substrate 36 is left as the cover film 32.

Accordingly, the formation of the chip-like semiconductor device 31 having the structure shown in FIG. 38 can be completed.

Figure 42:
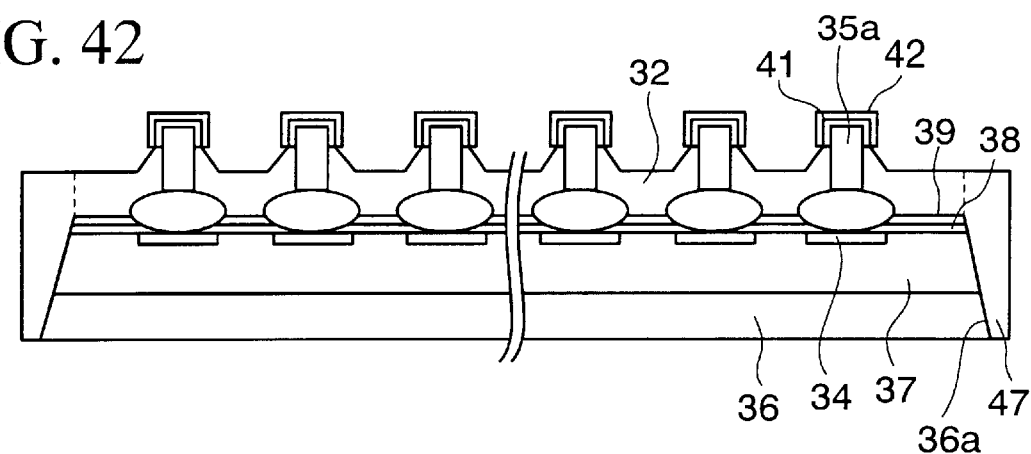
FIG. 42 is a sectional view showing a ninth semiconductor device according to the fourth embodiment of the present invention.
Figure 43:
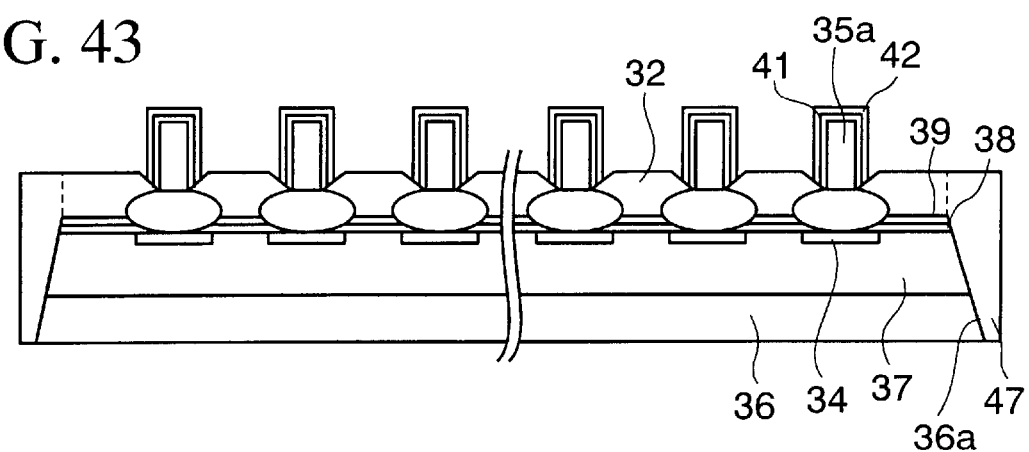
FIG. 43 is a sectional view showing a tenth semiconductor device according to the fourth embodiment of the present invention.
Figure 44:
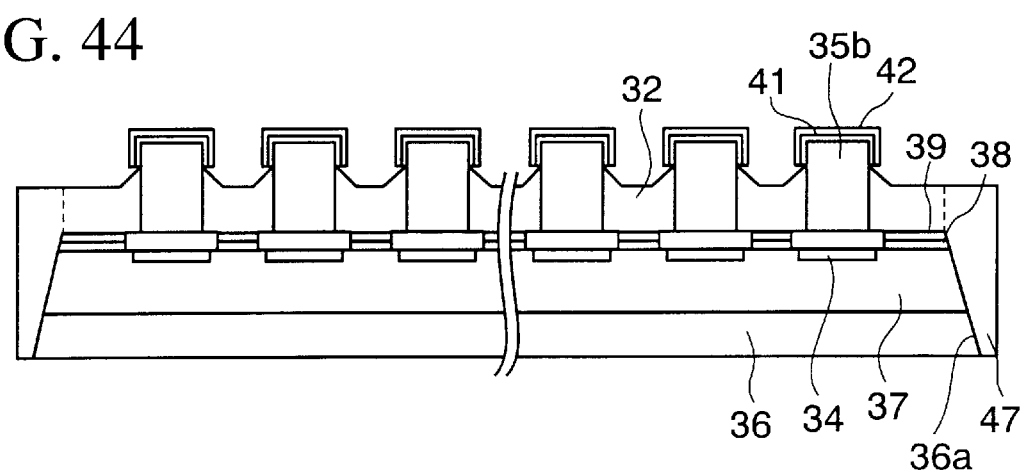
FIG. 44 is a sectional view showing an eleventh semiconductor device according to the fourth embodiment of the present invention.

FIG. 42, FIG. 43 and FIG. 44 show semiconductor substrates 36 that are formed via a step of forming the grooves 51 by using the tapered blade, and tapered surfaces 36a are formed on the side surfaces.

Figure 45A:
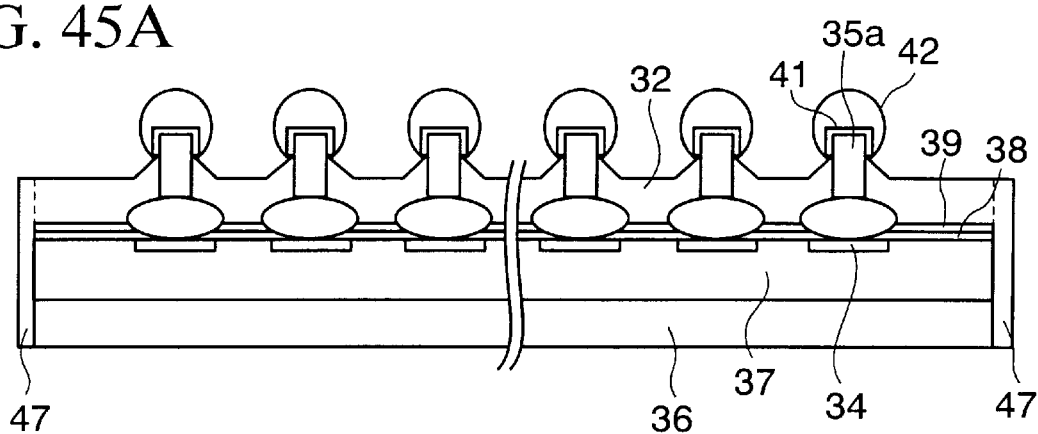
FIGS. 45A and 45B are sectional views showing twelfth and thirteenth semiconductor devices according to the fourth embodiment of the present invention respectively.
Figure 45B:
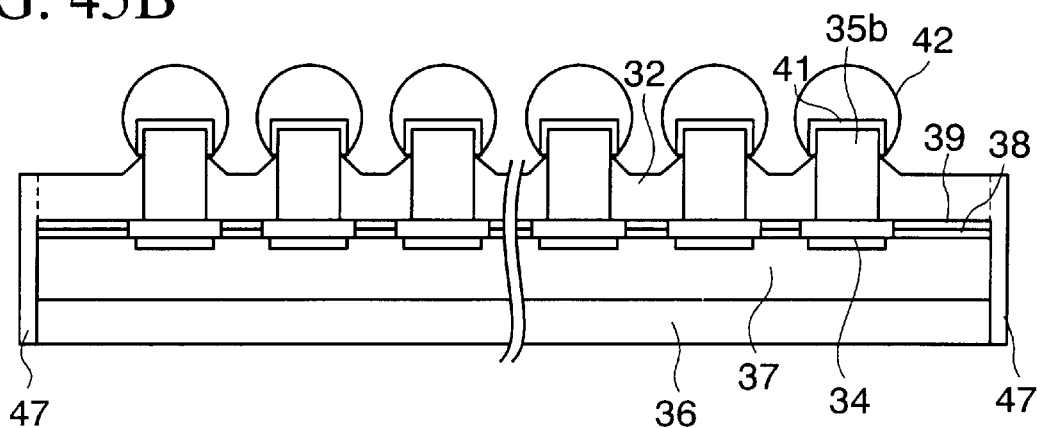

Also, the solder layer formed on the surfaces of the projection-like electrodes 35 may be formed as the substantially spherical shape. For example, solder layers 42 whose outer shape is a cylindrical shape or a needle shape are formed on the surfaces of the projection-like electrodes 35 in FIG. 38 and FIG. 40, but they may be formed as the substantially spherical shape, as shown in FIGS. 45A and 45B. The solder layers 42 whose outer shape is substantially spherical shape may be formed by a plating method, a ball mounting method, a printing method, etc.

Figure 46:
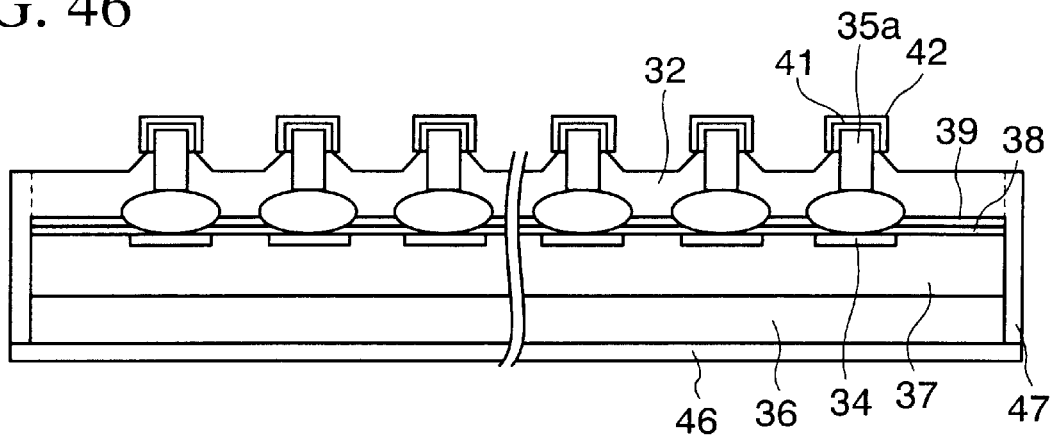
FIG. 46 is a sectional view showing the twelfth semiconductor device according to the fourth embodiment of the present invention.
Figure 47:
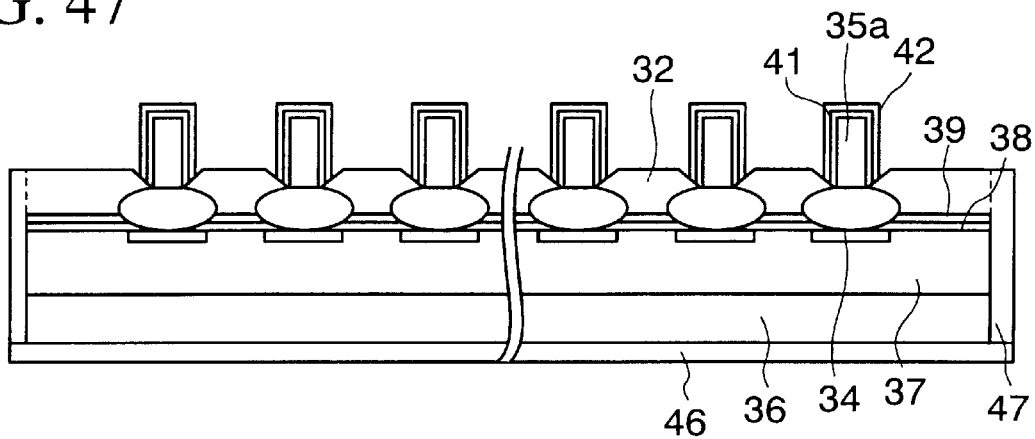
FIG. 47 is a sectional view showing the thirteenth semiconductor device according to the fourth embodiment of the present invention.
Figure 48:
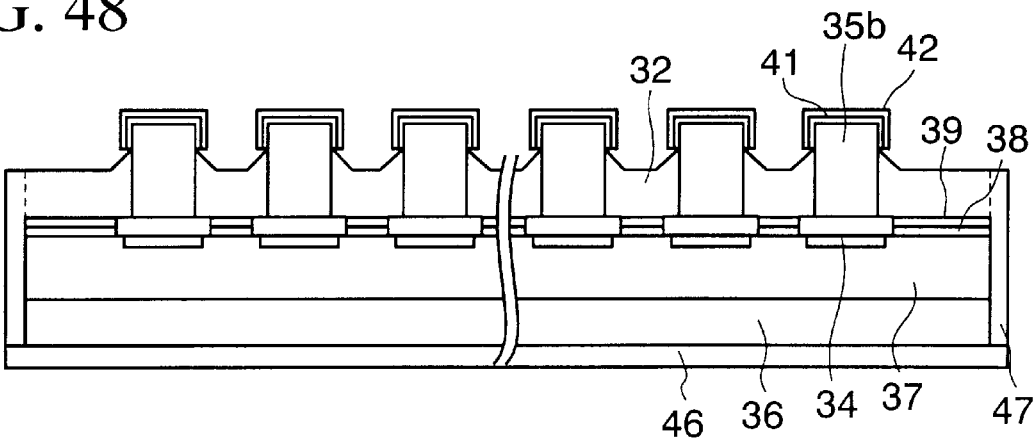
FIG. 48 is a sectional view showing a fourteenth semiconductor device according to the fourth embodiment of the present invention.

(iii) A structure in which a coating film is formed on an upper surface, a back surface, and side surfaces of the substrate FIG. 46, FIG. 47, and FIG. 48 are sectional views showing structures in which the under coating film 47 is formed on a back surface of the semiconductor substrate 36 shown in FIG. 17, FIG. 21, and FIG. 22 respectively and the side coating film 47 is formed on side surfaces of the semiconductor substrates 36, respectively.

The under coating film 46 and the side coating film 47 are formed of a resin such as polyimide, benzocyclobutene, bismalimide, silicon resin, epoxy resin, etc., for example, or a metal such as copper (Cu), titanium (Ti), aluminum (Al), nickel (Ni), etc.

Then, steps of forming the semiconductor device 31 shown in FIG. 46 will be explained hereunder.

First, as shown in FIG. 41E, the grooves 51 are formed on the semiconductor wafer 50, then the resin film 47a is formed, and then the back surface of the semiconductor wafer 50 is polished by a CMP method or a back grinding method.

Figure 49A:
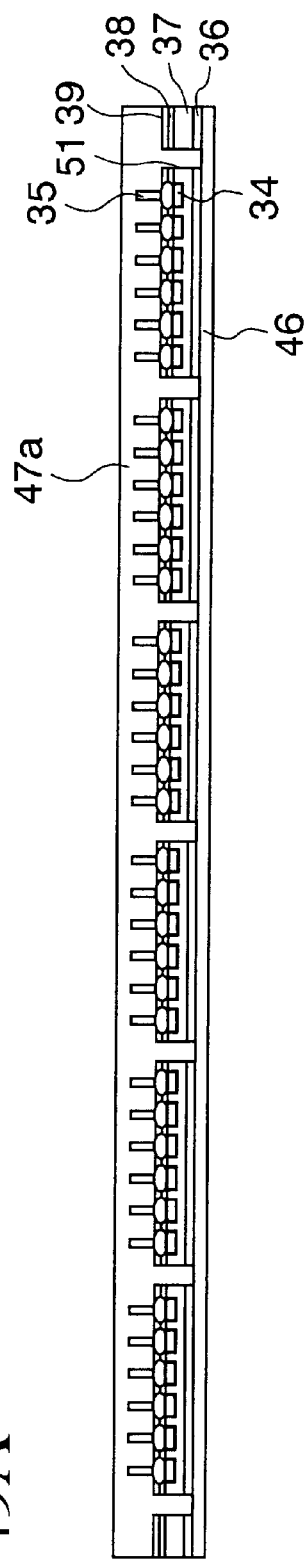
FIGS. 49A to 49C are sectional views showing steps of forming the twelfth, thirteenth, or fourteenth semiconductor device according to the fourth embodiment of the present invention.

Then, as shown in FIG. 49A, the under coating film 46 made of the resin or the metal is formed on the back surface of the semiconductor wafer 50. Such resin is formed on a lower surface of the semiconductor wafer 50 by a method such as a spin coating method, a dispensing method, a printing method, a molding method, etc. Also, such metal is formed on a lower surface of the semiconductor wafer 50 by a method such as a sputter method, a plating method, a laminating method, etc.

Figure 49B:
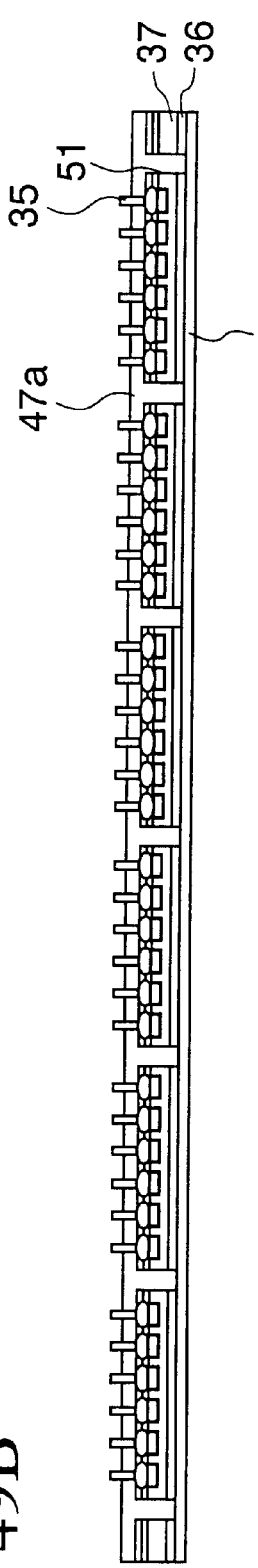

Then, as shown in FIG. 49B, the resin film 47a is thinned until the upper portions of the metal wires 35a are exposed.

Figure 49C:
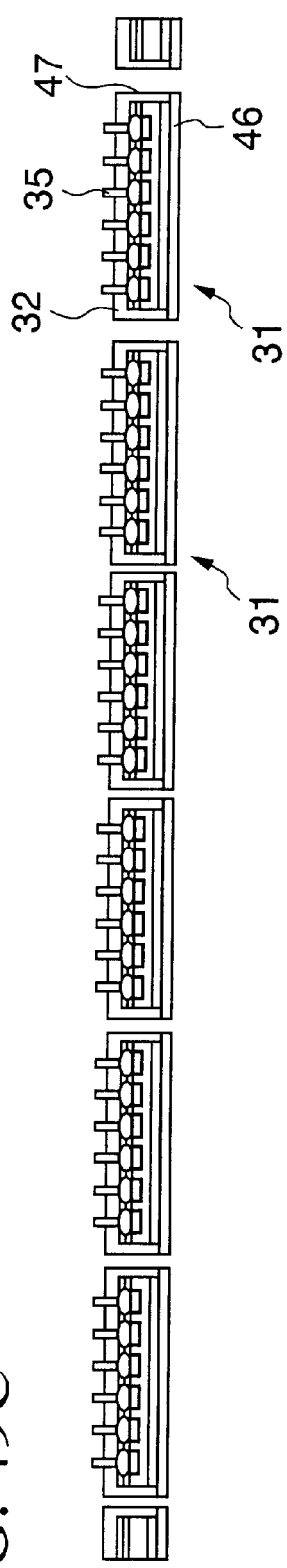

Then, as shown in FIG. 49C, when the semiconductor devices 31 are separated into chips by cutting the resin film 47a in the grooves 51 and the under coating layer 47, the under coating layer 47 covers the lower portion of the semiconductor device 31 as it is, and the resin film 47a left on the side surfaces of the semiconductor device 31 acts as the side coating layer 47, and also the resin film 47a left on the semiconductor device is left as the cover film 32.

Accordingly, the formation of the chip-like semiconductor device 31 having the structure shown in FIG. 46 can be completed.

Figure 50:
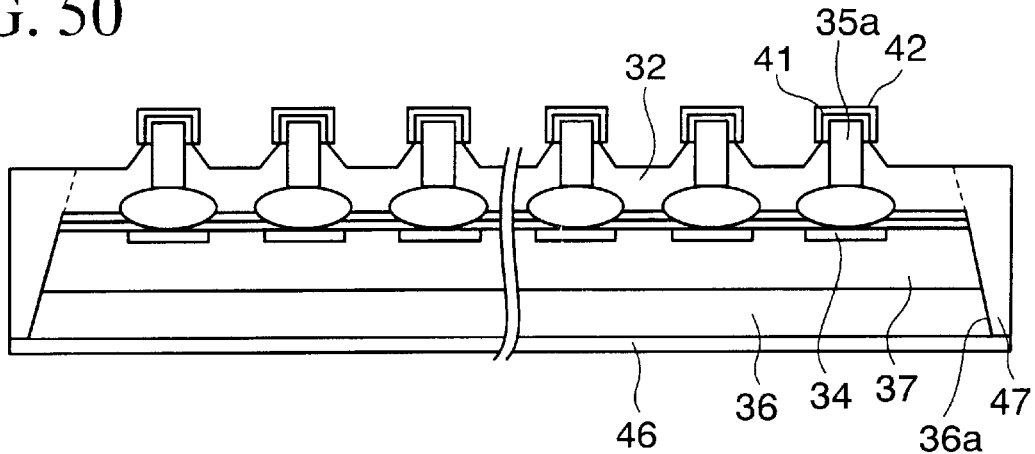
FIG. 50 is a sectional view showing a fifteenth semiconductor device according to the fourth embodiment of the present invention.
Figure 51:
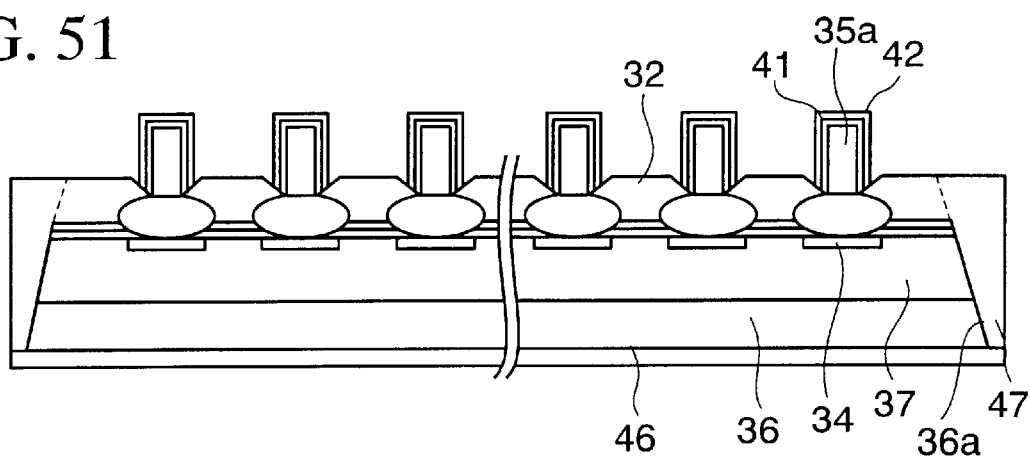
FIG. 51 is a sectional view showing a sixteenth semiconductor device according to the fourth embodiment of the present invention.
Figure 52:
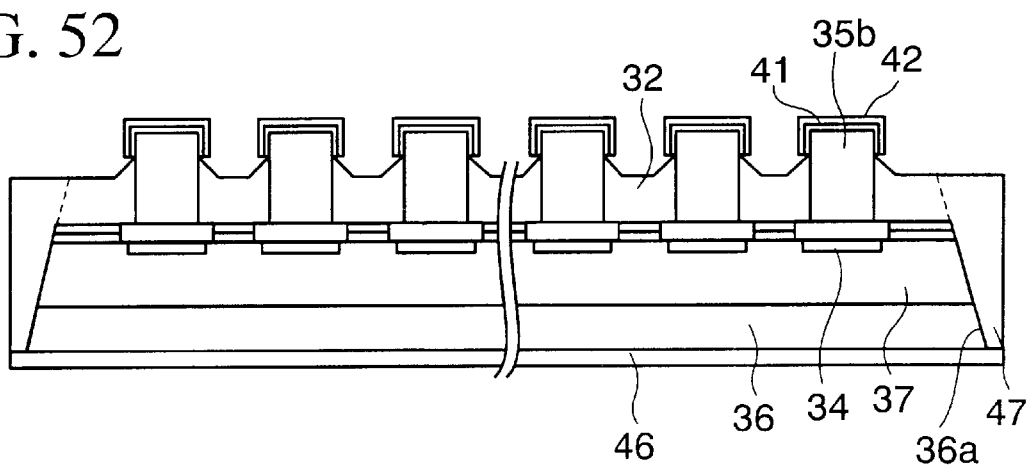
FIG. 52 is a sectional view showing a seventeenth semiconductor device according to the fourth embodiment of the present invention.

FIG. 50, FIG. 51 and FIG. 52 show semiconductor devices 31 that are obtained by forming the grooves 51 by using the tapered blade, and the tapered surfaces 36a are formed on the side surfaces.

Figure 53A:
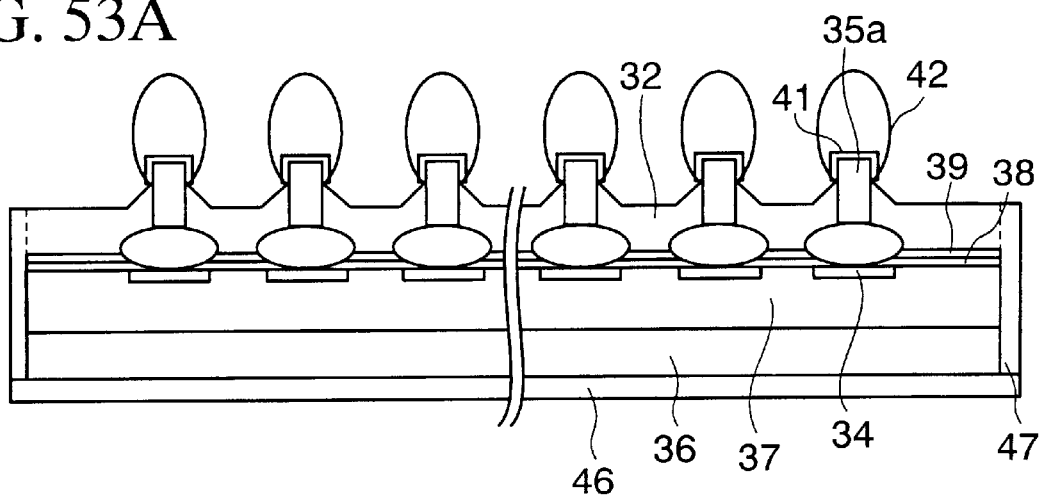
FIGS. 53A and 53B are sectional views showing eighteenth and nineteenth semiconductor devices according to the fourth embodiment of the present invention respectively.
Figure 53B:
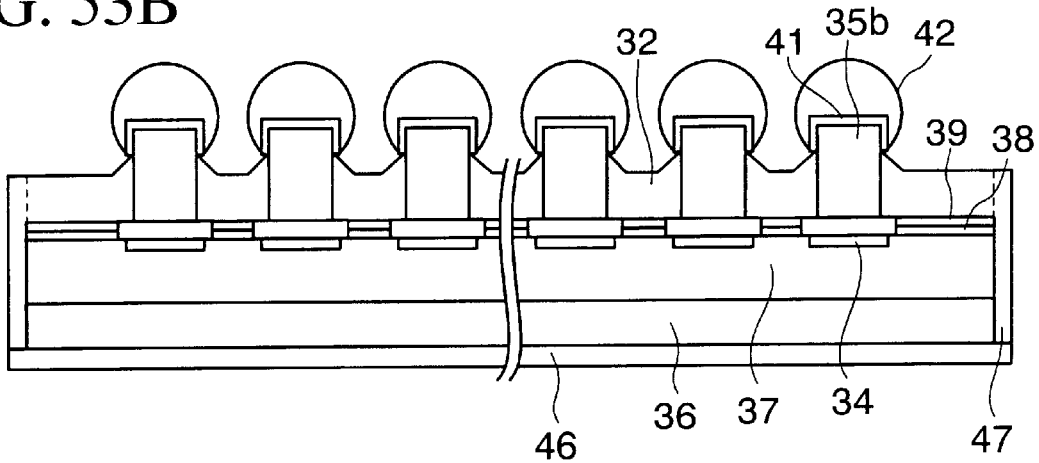

Also, the solder layer formed on the surfaces of the projection-like electrodes 35 may be formed as the substantially spherical shape. For example, the solder layers 42 whose outer shape is cylindrical or a needle shape are formed on the surfaces of the projection-like electrodes 35 in FIG. 46, FIG. 47 and FIG. 48, but they may be formed as the substantially spherical shape, as shown in FIGS. 53A and 53B. The solder layers 42 whose outer shape is substantially spherical may be formed by a plating method, a ball mounting method, a printing method, etc.

The above coating films 46, 47 may be formed on the back surface and the side surfaces of the semiconductor device 31 having relocation wirings 44 shown in FIG. 26 to FIG. 32D.

As described above, according to the present invention, the external connection terminals are constructed by forming a phosphorus or boron-containing nickel layer, a rich phosphorus or rich boron-containing nickel layer that contains phosphorus or boron higher in concentration than that in the phosphorus or boron-containing nickel layer, the nickel-tin alloy layer, the tin-rich tin alloy layer, and the tin alloy solder layer in sequence on the electrode, otherwise the external connection terminals are constructed by forming a phosphorus or boron-containing nickel-copper layer, a rich phosphorus or rich boron-containing nickel-copper layer that contains phosphorus or boron higher in concentration than phosphorus or boron-containing nickel-copper layer, the nickel-copper-tin ally layer, and the tin alloy solder layer in sequence on the electrode.

According to such external connection terminals, after the tin alloy solder layer is heated/melted to exceed the melting point, no Kirkendall void is generated to weaken the external connection terminal is generated. Therefore, the adhesiveness between respective layers can be improved and, thus, the reliability of the external connection terminals can be enhanced.

Also, according to the present invention, in the chip-like semiconductor device having the projection-like electrodes, the coating film made of organic insulating material or metal is formed on at least one of the back surface and the sides surfaces of the semiconductor substrate. Therefore, the chipping or the crack is difficult to occur on the back surface and the sides surfaces of the semiconductor substrate, and, thus, the yield of the semiconductor devices can be improved by preventing the damage of the semiconductor circuits.

What is claimed is:

1. An external connection terminal comprising:
   an electrode formed on a substrate;
   a first-element containing nickel layer formed as a barrier metal on the electrode to contain a first element consisting of any one of phosphorus and boron;
   a rich first-element containing nickel layer formed on the first-element containing nickel layer to contain a greater concentration of the first element than that in the first-element containing nickel layer;
   a nickel-tin alloy layer formed on the rich first-element containing nickel layer;
   a tin alloy layer formed on the nickel-tin alloy layer; and
   a tin alloy solder layer formed on the tin alloy layer.

2. An external connection terminal according to claim 1, wherein copper is contained in the nickel-tin alloy layer, and the tin alloy solder layer, respectively.

3. An external connection terminal according to claim 1, wherein the tin alloy layer is a tin-palladium layer.

4. An external connection terminal according to claim 1, wherein the first-element containing nickel layer contains the first element by 1 to 15 wt %.

5. An external connection terminal according to claim 1, wherein the tin alloy layer contains tin at a concentration of less than 52 wt %.

6. An external connection terminal, according to claim 1, wherein the tin alloy solder layer contains tin at a concentration of more than 5 wt %.

7. An external connection terminal according to claim 1, wherein the substrate is a semiconductor substrate.

8. An external connection terminal according to claim 7, wherein a coating film made of organic insulating material or metal is formed on at least one of side surfaces and a back surface of the semiconductor substrate.

9. An external connection terminal according to claim 1, wherein the electrode is formed of a conductor containing copper or aluminum as a principal component, or aluminum, or copper.

10. An external connection terminal according to claim 1, wherein the electrodes are projection-like electrodes that are electrically connected to metal patterns on the substrate or the insulating film.

11. An external connection terminal according to claim 1, wherein a thickness of the tin alloy layer is 10 to 200 nm.

12. An external connection terminal according to claim 1, wherein a thickness of the rich first-element containing nickel layer is 50 to 500 nm.

13. An external connection terminal according to claim 1, wherein the tin alloy solder layer has a substantially spherical or substantially cylindrical or substantially needle-like outer shape.

14. An external connection terminal comprising:
    an electrode formed on a substrate;
    a first-element containing nickel-copper layer formed as a barrier metal on the electrode to contain a first element consisting of any one of phosphorus and boron;
    a rich first-element containing nickel-copper layer formed on the first-element containing nickel-copper layer to contain a greater concentration of the first element than that in the first-element containing nickel-copper layer;
    a nickel-copper-tin alloy layer formed on the rich first-element containing nickel-copper layer; and
    a tin alloy solder layer formed on the nickel-copper-tin alloy layer.

15. An external connection terminal according to claim 14, wherein the tin alloy solder layer contains copper.

16. An external connection terminal according to claim 14, wherein the first-element containing nickel-copper layer contains the first element by 1 to 15 wt %.

17. An external connection terminal according to claim 14, wherein the nickel-copper-tin alloy layer contains tin at a concentration of less than 52 wt %.

18. An external connection terminal according to claim 14, wherein the tin alloy solder layer contains tin at a concentration of more than 5 wt %.

19. An external connection terminal according to claim 14, wherein the substrate is a semiconductor substrate.

20. An external connection terminal according to claim 19, wherein a coating film made of organic insulating material is formed on at least one of side surfaces and a back surface of the semiconductor substrate.

21. An external connection terminal according to claim 14, wherein the electrode is formed of a conductor containing copper or aluminum as a principal component, or aluminum, or copper.

22. An external connection terminal comprising:
    an insulating film formed on a substrate;
    a first-element containing nickel layer formed as a barrier metal on the insulating film to contain a first element consisting of any one of phosphorus and boron;

a rich first-element containing nickel layer formed on the first-element containing nickel layer to contain a greater concentration of the first element than that in the first-element containing nickel layer;

a nickel-tin alloy layer formed on the rich first-element containing nickel layer;

a tin alloy layer formed on the nickel-tin alloy layer; and a tin alloy solder layer formed on the tin alloy layer.

23. An external connection terminal according to claim 1, wherein the substrate is an insulating substrate.

24. An external connection terminal according to claim 22, wherein the substrate is an insulating substrate.

25. An external connection terminal comprising:

an insulating film formed on a substrate;

a first-element containing nickel-copper layer formed as a barrier metal on the insulating film to contain a first element consisting of any one of phosphorus and boron;

a rich first-element containing nickel-copper layer formed on the first-element containing nickel-copper layer to contain a greater concentration of the first element than that in the first-element containing nickel-copper layer;

a nickel-copper-tin alloy layer formed on the rich first-element containing nickel-copper layer; and a tin alloy solder layer formed on the nickel-copper-tin alloy layer.

26. An external connection terminal according to claim 14, wherein the substrate is an insulating substrate.

27. An external connection terminal according to claim 25, wherein the substrate is an insulating substrate.

28. An external connection terminal according to claim 19, wherein a coating film made of metal is formed on at least one of side surfaces and a back surface of the semiconductor substrate.

* * * * *